(12) United States Patent
Rorato

(10) Patent No.: US 9,798,835 B2
(45) Date of Patent: Oct. 24, 2017

(54) GROUPS OF FACES THAT FORM A GEOMETRICAL PATTERN

(71) Applicant: Dassault Systemes, Velizy Villacoublay (FR)

(72) Inventor: Remy Rorato, Paris (FR)

(73) Assignee: Dassualt Systemes, Velizy, Villacoublay (FR)

( * ) Notice: Subject to any disclaimer, the term of this patent is extended or adjusted under 35 U.S.C. 154(b) by 863 days.

(21) Appl. No.: 14/139,600

(22) Filed: Dec. 23, 2013

(65) Prior Publication Data

US 2014/0188439 A1    Jul. 3, 2014

(30) Foreign Application Priority Data

Dec. 31, 2012   (EP) .................................... 12306720

(51) Int. Cl.
  *G06F 17/50*  (2006.01)
  *G06T 17/10*  (2006.01)
  *G06T 19/20*  (2011.01)

(52) U.S. Cl.
  CPC .......... *G06F 17/50* (2013.01); *G06F 17/5004* (2013.01); *G06T 17/10* (2013.01); *G06T 19/20* (2013.01); *G06T 2219/2016* (2013.01); *G06T 2219/2021* (2013.01)

(58) Field of Classification Search
  USPC ................................ 703/2; 345/473; 706/54
  See application file for complete search history.

(56) References Cited

U.S. PATENT DOCUMENTS 6,721,614 B2   4/2004  Duncan et al.
6,768,928 B1   7/2004  Nagasawa et al.
(Continued)

FOREIGN PATENT DOCUMENTS

EP    0 646 884 A2    4/1995
EP    0 646 884 A3    4/1995
(Continued)

OTHER PUBLICATIONS

Babic, B., et al., "A Review of Automated Feature Recognition with Rule-Based Pattern Recognition," Computers in Industry, 59:321-337 (2008).
(Continued)

*Primary Examiner* — Thai Phan
(74) *Attorney, Agent, or Firm* — Hamilton, Brook, Smith & Reynolds, P.C.

(57) ABSTRACT

It is provided a computer-implemented method for designing a three-dimensional modeled object. The method comprises providing a boundary representation of the modeled object; determining a subset of the set of faces for which the faces are a copy one of another; forming a first group of faces within the subset that form a geometrical pattern; and associating to the first group of faces at least one second group of faces that are, for each face of the second group, adjacent to a respective face of the first group and that are, for each pair of faces of the second group, compliant with the rigid motion that transforms, one into the other, the respective faces of the first group to which the faces of the pair are adjacent. Such a method improves the design of a 3D modeled object.

13 Claims, 12 Drawing Sheets

(56) References Cited

U.S. PATENT DOCUMENTS

| | | | |
|---|---|---|---|
| 6,778,970 B2* | 8/2004 | Au | G06F 17/2785 706/54 |
| 7,027,054 B1* | 4/2006 | Cheiky | H04N 5/262 345/473 |
| 7,269,808 B2 | 9/2007 | Bruce et al. | |
| 7,688,318 B2 | 3/2010 | O'Malley, III et al. | |
| 7,733,340 B1 | 6/2010 | Desimone et al. | |
| 8,812,272 B2 | 8/2014 | Martin et al. | |
| 9,449,430 B2 | 9/2016 | Janvier | |
| 2002/0008700 A1 | 1/2002 | Fuki | |
| 2002/0095276 A1 | 7/2002 | Rong et al. | |
| 2003/0191627 A1* | 10/2003 | Au | G06F 17/2785 704/9 |
| 2007/0279414 A1 | 12/2007 | Vandenbrande | |
| 2008/0143714 A1 | 6/2008 | Huang | |
| 2009/0182450 A1 | 7/2009 | Goldschmidt | |
| 2011/0224813 A1 | 9/2011 | Takatsuka | |
| 2012/0078587 A1 | 3/2012 | Martin et al. | |
| 2014/0184594 A1 | 7/2014 | Janvier | |
| 2014/0188439 A1 | 7/2014 | Rorato | |
| 2014/0354636 A1 | 12/2014 | Rorato et al. | |
| 2016/0350335 A1 | 12/2016 | Rorato | |
| 2016/0350387 A1 | 12/2016 | Marini et al. | |

FOREIGN PATENT DOCUMENTS

| | | |
|---|---|---|
| EP | 0 964 364 A2 | 12/1999 |
| EP | 2 169 567 A2 | 3/2010 |
| EP | 2 387 004 A1 | 11/2011 |
| WO | WO 2004/068300 A2 | 8/2004 |
| WO | WO 2008/094170 A1 | 8/2008 |
| WO | WO 2011/103031 A1 | 8/2011 |
| WO | WO 2015/085435 A1 | 6/2015 |

OTHER PUBLICATIONS

Bespalov, D., et al., "Local Feature Extraction and Matching Partial Objects, " *Computer Aided Design*, vol. 38: 1020-1037 (2006).

Creo™ Parametric Data Sheet, © 2011 Parametric Technology Corporation, available at http://www.creo.uk.com/creo_parametric_mapping.htm, last accessed Mar. 27, 2014.

Falcidieno, B. and Giannini, F., "A System for Extracting and Representing Feature Information Driven by the Application Context," Proceedings of the IEE International Conference on Robotics and Automation, 1672-1678 (1990).

Santa-Cruz, D. and Ebrahimi, T., "Compression of Parametric Surfaces for Efficient 3D Model Coding," *VCIP*, 4671:280-291 (2002).

Shih, R., *Parametric Modeling with Creo™ Parametric: An Introduction to Creo™ Parametric 1.0*, SDC Publications © 2011 (table of contents only).

Shikhare, D., et al., "Compression of Large 3D Engineering Models Using Automatic Discovery of Repeating Geometric Features," *National Centre for Software Technology*, 233-240 (2001).

European Search Report, European Application No. EP 12 30 6721, Dated May 13, 2013.

European Search Report, European Application No. EP 13 30 5700, Dated: Aug. 14, 2013.

European Search Report from EP 12 30 6720, date of completion Jul. 4, 2013.

Pauly, et al., "Discovering structural regularity in 3D geometry", ACM Transactions on Graphics ACM USA, vol. 27, No. 3, Aug. 2008 (Aug. 2008),p. 43 (11 pp.).

Ismail, et al., "Feature recognition patterns for form features using boundaryrepresentation models",International Journal of Advancedmanufacturing Technology Spri nger-Verlagu K,vol. 20, No. 8, 2002, pp. 553-556.

Kao, et al., "Extraction of 3D Objectfeatures From CAD Boundary Representation Using the Super Relation Graph Method", Transactions on Pattern Analysis and Machine Intelligence, IEEE, Piscataway, USA, vol. 17, No. 12, Dec. 1, 1995 (Dec. 1, 1995), pp. 1228-1233.

Naoufel, W., "Extracting Ordered Patterns from a Triangular Mesh Surface",IEEE Potentials, IEEE, New York, NY, US,vol. 30, No. 6,Nov. 1, 2011 (Nov. 1, 2011), pp. 34-43.

Wang, et al., "EQSM: An efficient high quality surface g rid generation methodbased on remeshing" ,Computer Methods i n Applied Mechanics Andengineering, North-Holland, Amsterdam, NL,vol. 195, No. 41-43,Aug. 15, 2006 (Aug. 15, 2006) , pp. 5621-5633.

Author: Lujie Ma, et al. Title: Automatic discovery of common design structures in CAD models; Publisher: Computer & Graphics 34 (2010) 545-555.

3DPartFinder by 3DSemantix—Geometric search engine > Home; http://www.3dpartfinder.com, 2 pages.

Altmeyer, J. et al., "Reuse of Design Objects in CAD Frameworks," IEEE/ACM International Conference on Computer-Aided Design, Digest of Technical Papers, pp. 754-761 (Nov. 6, 1994).

Biasotti, S. et al., "Sub-part correspondence by structural descriptors of 3D shapes," *Computer-Aided Design*, 38(9): 1002-1019 (Sep. 2006).

Brière-Côté, Antoine et al., "Comparing 3D CAD Models: Uses, Methods, Tools and Perspectives," *Computer-Aided Design & Applications*, 9(6): 771-794 (2012).

Clark, D.E.R. et al., "Benchmarking shape signatures against human perceptions of geometric similarity," *Computer-Aided Design*, 38(9): 1038-1051 (Sep. 2006).

Cornelio A. et al., "Integration and Cataloging of Engineering Design Information," *Systems Integration '90*, IEEE Comput., Soc., US, pp. 720-729 (Apr. 23, 1990).

European Search Report, European Application No. EP 10 30 6026, Date of Completion of Search: Feb. 3, 2011, 8 pages.

Fonseca, M.J. et al., "Towards content-based retrieval of technical drawings through high-dimensional indexing," *Computers and Graphics*, 27(1): 61-69 (Feb. 2003).

Funkhouser, T. et al., "Modeling by Example," *ACM Transactions on Graphics*, 23(3): 652-663 (Aug. 1, 2004).

Funkhouser, Thomas et al., "A Search Engine for 3D Models," *ACM Transactions on Graphics*, vol. V, No. N, 10 202002, 28 Pages.

Imoru, C.O. et al., "On a Version of the Banach's Fixed Point Theorem," *General Mathematics*, vol. 16, Nr. 1, pp. 25-32 (2008).

Kazhdan, M. et al. "Harmonic 3D Shape Matching," ACM SIGGRAPH Symposium on Computer Animation, p. 191 (Jul. 21, 2002).

Kazhdan, Michael et al., "Rotation Invariant Spherical Harmonic Representation of 3D Shape Descriptors," *Eurographics Symposium on Geometry Processing*, 9 pages (2003).

Lee, K.S. et al., "Framework of an evolutionary design system incorporating design information and history," *Computers in Industry*, 44(3): pp. 205-227 (Apr. 2001).

Maranzana, Roland, "3D Data Mining Part and Information Re-Use in a PLM Context," Proceedings of GT2007, May 14-17, 2013, Montreal, Canada, ASME Paper: GT2007-27966, American Society of Mechanical Engineers, New York, NY, 2007. http://dx.doi.org/10.1115/GT2007-27966, 37 pages (2013).

Papadakis, P. et al, "Efficient 3D shape matching and retrieval using a concrete radialized spherical projection representation," *ScienceDirect*, 40: 2437-2452 (2007).

Munkres, James, R., "Elements of algebraic topology", Addison-Wesley Publishing Company, Inc. (1984).

Daras, P., et al., "A 3D Shape Retrieval Framework Supporting Multimodal Queries", Int J Comput Vis 89: 229-247 (2010).

Yang, M., et al., "A Survey of Shape Feature Extraction Techniques". Peng-Yeng Yin. Pattern Recognition, IN-TECH, pp. 43-90 (2008).

Petre, R.D., et al.,"An experimental evaluation of view-based 2D/3D indexing methods", 2010 IEEE 26th Convention of Electrical and Electronics Engineers in Israel, Nov. 2010, Israel. pp. 924-928.

Beardsley, J., "Seamless Servers: the case for and against", Massively Multiplayer Game Development, Section 3.1, 211-227 (2003).

(56) References Cited

OTHER PUBLICATIONS

Boltcheve, D., "An Iterative Algorithm for Homology Computation on Simplical Shapes", Computer Aided Design, vol. 43, No. 11, pp. 1457-1467 Sep. 2, 2011.
Cardone, A., et al. "A Survey of Shape Similarity Assessment Algorithms for Product Design and Manufacturing Applications", Journal of Computing and Information Science in Engineering, vol. 3 No. 2, pp. 109-118, Jan. 1, 2003.
EP Search Report for EP 16 17 6763 dated Dec. 1, 2016.
EP Search Report for EP 16 30 6488 dated May 23, 2017.
Frosini, P., et al. "Combining Persistent Homology and Invariance Groups for Shape Comparison", Discrete & Computational Geometry, vol. 55, No. 2, pp. 373-409, Feb. 2, 2016.
Oudot, S., Topological Signatures:, Presentation given in Springs School in La Marsa, pp. 1-86, Apr. 2016.
Tangelder, J., et al., "A Survey of Content Based 3D Shape Retrieval Methods", Multimedia Tools and Applications, Kluwer Academic Publishers, vol. 39, No. 3, pp. 441-471; Dec. 8, 2007.
Werghi, D., et al. "Extracting Ordered Patterns from a Triangular Mesh Surface", IEEE Potentials, IEEE, NY, NY, USA, vol. 30, No. 6, pp. 34-43, Nov. 1, 2011.
Working with Pattern Recognition; http://learningexchange.ptc.com/tutorial/519/working-with-pattern-recognition (2014).
Wagner, et al. "Modeling Software with Finite State Machines", Auerbach Publications, 2006.
Chiang, L., et al. "Identification of Patterns of Repeated Parts in Solid Objects", IMATI Report Series, pp. i-111, Nov. 2, 2016.
Dang, Q.V., et al., "Similarity Detection for Free-Form Parametric Models", 21st International Conference on Computer Graphics, Visualization and Computer Vision, pp. 239-248 (2013).
European Search Report for EP 16 30 6790 dated Jun. 7, 2017, 3 pages.
Gordon, L., "Comparing 3D CAD Modelers—What Designers should know about history-based and dynamic schemes", Machine Design, pp. 1-4, Nov. 22, 2006.

\* cited by examiner

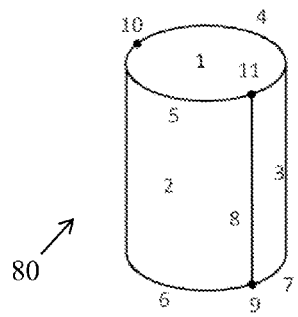
FIG. 4
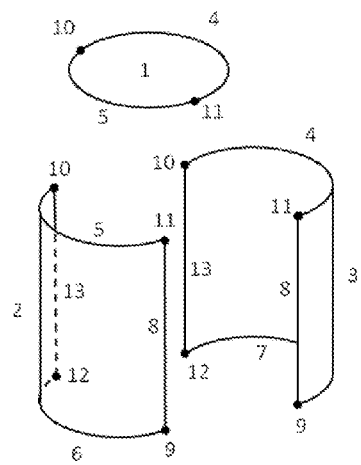
FIG. 5
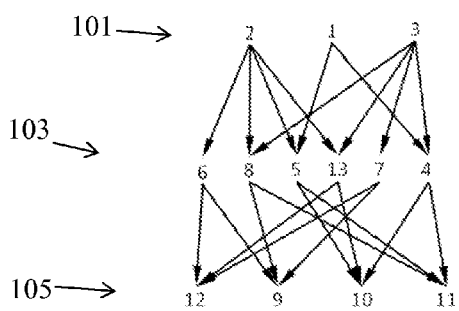
FIG. 6
1 → Plane
2 → Cylindrical surface
3 →
4 →
5 → Circle 1
6 → Circle 2
7 →
8 → Line 1
9 → Point 4
10 → Point 1
11 → Point 2
12 → Point 3
13 → Line 2
FIG. 7
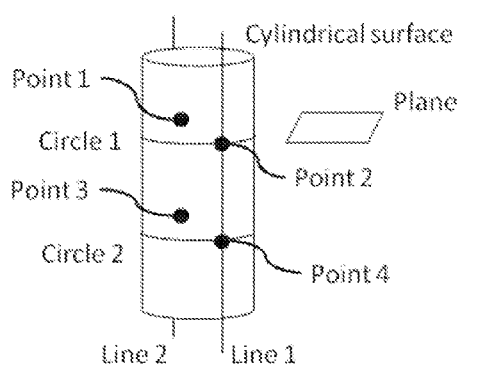
FIG. 8

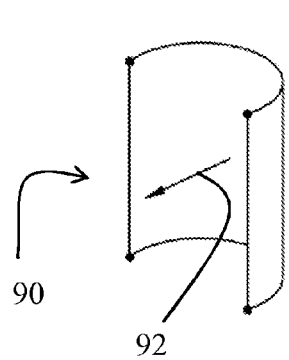
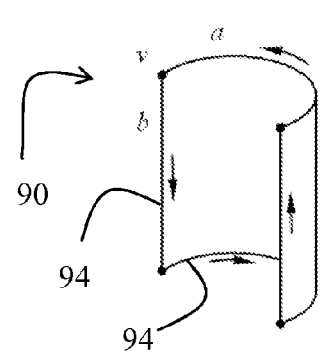
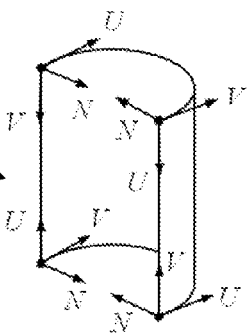
FIG. 9　　　　FIG. 10　　　　FIG. 11
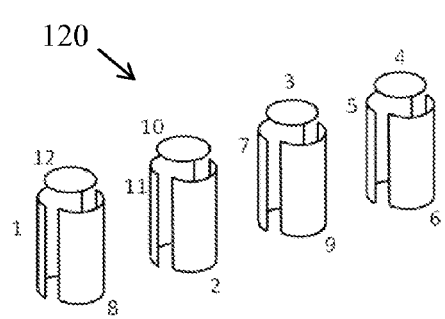
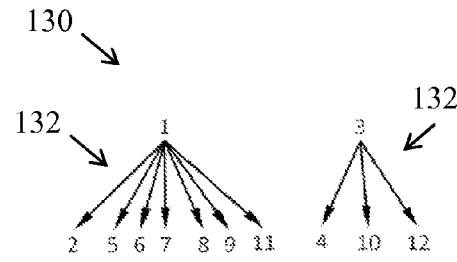
FIG. 12　　　　FIG. 13
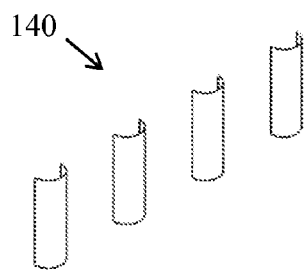
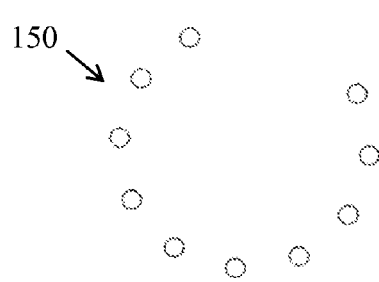
FIG. 14　　　　FIG. 15

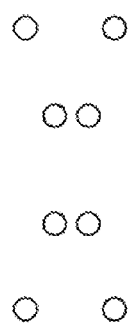
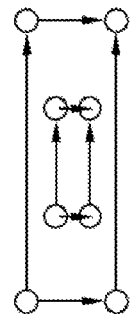
FIG. 32  FIG. 33  FIG. 34
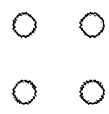
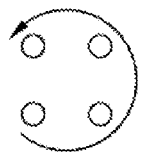
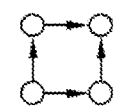
FIG. 35  FIG. 36  FIG. 37
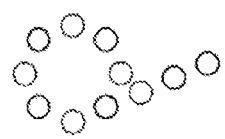
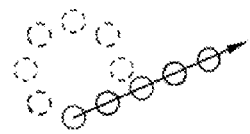
FIG. 38  FIG. 39  FIG. 40

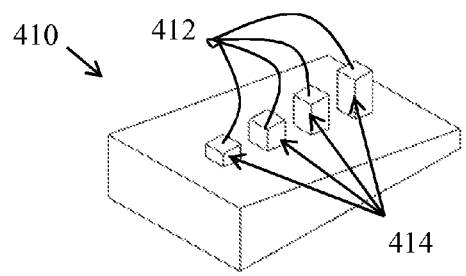
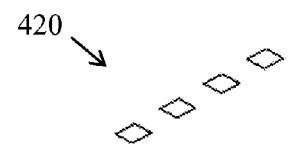
FIG. 41          FIG. 42
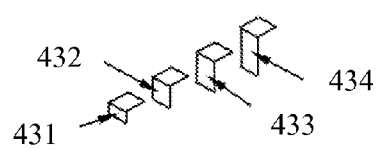
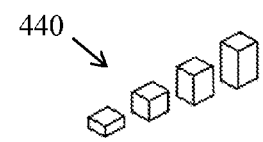
FIG. 43          FIG. 44
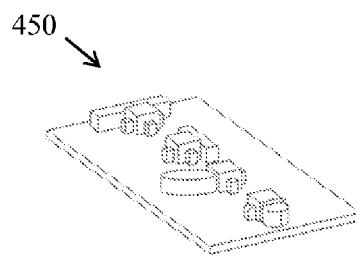
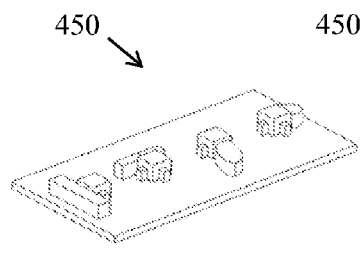
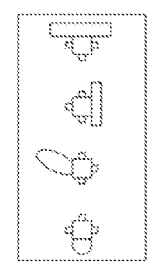
FIG. 45     FIG. 46     FIG. 47
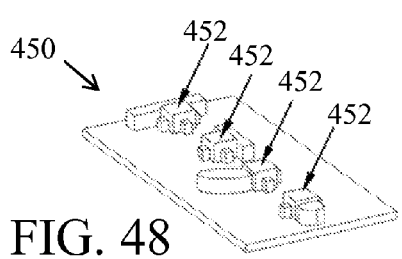
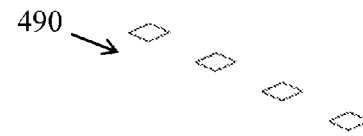
FIG. 48          FIG. 49

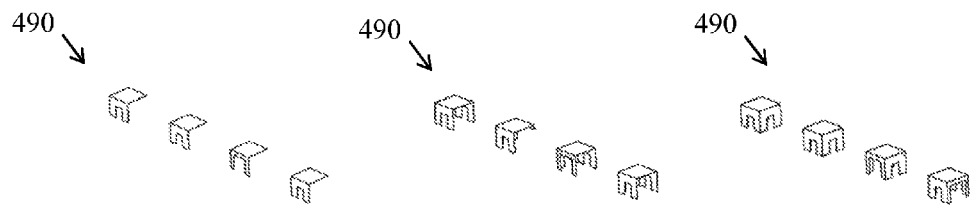
FIG. 50  FIG. 51  FIG. 52
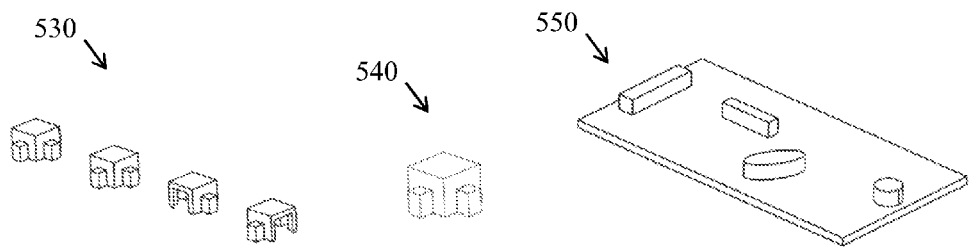
FIG. 53  FIG. 54  FIG. 55
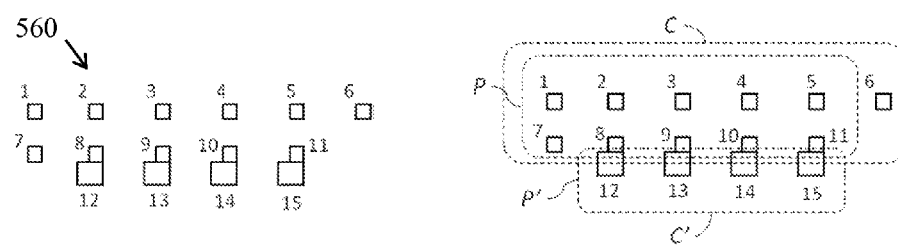
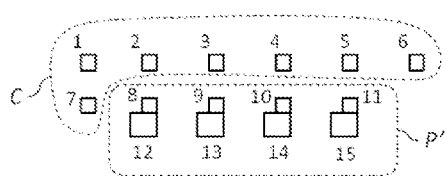
FIG. 58
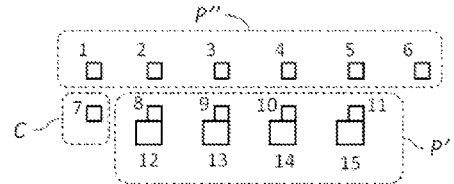
FIG. 59

GROUPS OF FACES THAT FORM A GEOMETRICAL PATTERN

RELATED APPLICATION(S)

This application claims priority under 35 U.S.C. §119 or 365 to European Patent Application No. 12306720.9 filed Dec. 31, 2012. The entire teachings of the above application are incorporated herein by reference.

FIELD OF THE INVENTION

The invention relates to the field of computer programs and systems, and more specifically to a method, system and program for designing a three-dimensional modeled (3D) modeled object.

BACKGROUND OF THE INVENTION

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such systems, the graphical user interface (GUI) plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise.

The PLM solutions provided by Dassault Systemes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

Many CAD systems now allow the user to design a 3D modeled object, based on a boundary representation (B-Rep) of the modeled object provided to the user. The B-Rep is a data format comprising a set of faces each defined as a bounded portion of a respective supporting surface. The user can act on the set of faces, by modifying existing faces, creating new faces, deleting some faces, and/or defining constraints on faces and/or between faces, or any actions of the like provided by the CAD system at use. In such a case, for efficiency purposes, the history of the solid is generally not available to the user.

One of the aspects of such 3D design under development is known as "pattern recognition". The term "pattern" refers to regular layouts of copies of the same geometric feature. Recognizing patterns allows the handling of such patterns as a single element during the design, thereby widening the array of design possibilities. For example, instead of modifying the elements of a pattern one by one, thanks to a prior recognition of the pattern, the user may perform modifications of the pattern globally e.g. with single actions. Pattern recognition is relevant in different domains of CAD, such as mechanical design, consumer goods, building architecture, aerospace, or other domains.

Pattern recognition may be related to feature recognition. Feature recognition is useful to recognize characteristic shapes on a given 3D object (typically a solid representing a mechanical part). Characteristic shapes of interest for mechanical design include for example holes, extruded pads, extruded pockets, fillets or rounds, revolute pads, and/or revolute pockets. Recognizing a characteristic shape amounts to identify its specifications through a better semantic level, for example the profile of an extruded or revolute shape, the revolution axis of a revolute shape, the radius value of rounds and fillets, an extrusion direction, and/or an extrusion depth. This information is used either to modify the shape, for example by editing the profile of the extrusion, or to feed a downstream process, machining process for example.

Feature recognition capabilities are available in commercial CAD systems through the following procedure. The user may select the type of feature to recognize. Then, optionally, the user selects one or more faces of the feature on the solid in order to initialize the searching. The system performs the recognition and yields the specifications of the recognized feature.

When the intent is to locally change the shape of the input solid, "direct editing" capability is also available. This technology, also named "history free modeling", is promoted by CAD editors as an alternative to history design. The goal is to easily change the shape of a solid by using only its B-Rep. In order to make the editing simple from the user point of view, the "direct editing" technology has to recognize the local shape of the solid. For example, the system has to maintain the cylindrical shape of a hole (and not change the cylinder into a free form surface), maintain the vertical direction of the pocket's walls, and/or maintain the revolute or extruded nature of a shape. Consequently, feature recognition is unavoidable, even in the "direct editing" field.

Traditional feature recognition deals with one feature at a time. It does not identify multiple copies of a given feature and it does not identify the layout of these copies. As for pattern recognition, the subject is still under development, but existing solutions seem to require many user-interventions.

Thus, the existing solutions lack efficiency, notably from a user utilization point of view and from an exhaustiveness point of view. Within this context, there is still a need for an improved solution for designing a 3D modeled object.

SUMMARY OF THE INVENTION

According to one aspect, it is therefore provided a computer-implemented method for designing a 3D modeled object. The method comprises providing a boundary representation of the modeled object. The boundary representation comprises a set of faces each defined as a bounded portion of a respective supporting surface. The method also comprises determining a subset of the set of faces of the boundary representation for which the faces are a copy one of another. The method also comprises forming a first group of faces within the subset that form a geometrical pattern. And the method comprises associating to the first group of faces at least one second group of faces. The faces of the second group are, for each face of the second group, adjacent to a respective face of the first group. The faces of the second group also are, for each pair of faces of the second group, compliant with the rigid motion that transforms, one into the other, the respective faces of the first group to which the faces of the pair are adjacent.

The method may comprise one or more of the following:
for the associating, a pair of faces is evaluated to be compliant with the rigid motion that transforms, one into the other, respective faces of the first group to which the faces of the pair are adjacent, when the rigid motion also transforms, one into the other, the supporting surfaces respective to the faces of the pair, at least in an area of adjacency of the faces of the pair to the respective faces of the first group;
the number of faces of the second group is higher than the number of faces of the first group minus a predetermined threshold;
the method further comprises associating to the first group of faces at least one group of blocks of faces that are, for each block, a set of connected faces adjacent to a respective face of the second group and that are, for each pair of blocks, compliant with the rigid motion;
the method is iterated, the faces included in the first group or associated to the first group in an iteration being discarded for the next iterations;
forming the first group of faces within the subset comprises testing whether an occurrence of one of a predetermined set of geometrical patterns is present within the subset;
the predetermined set of geometrical patterns includes a set of recurrently defined patterns;
the set of recurrently defined patterns includes a one-dimensional pattern including a linear pattern and/or a circular pattern, and/or a grid pattern including a rectangular grid pattern and/or a circular grid pattern;
the testing includes browsing the predetermined set of geometrical patterns according to a priority order;
the predetermined set of geometrical patterns includes, a circular grid pattern, a rectangular grid pattern, a circular pattern, and then a linear pattern; and/or
the testing includes browsing the predetermined set of geometrical patterns according to a priority order that orders, from highest priority to lowest priority, the circular grid pattern, the rectangular grid pattern, the circular pattern, and then the linear pattern.

It is further proposed a computer program comprising instructions for performing the above method. The computer program is adapted to be recorded on a computer readable storage medium.

It is further proposed a computer readable storage medium having recorded thereon the above computer program.

It is further proposed a CAD system comprising a processor coupled to a memory and a graphical user interface, the memory having recorded thereon the above computer program.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Embodiments of the invention will now be described, by way of non-limiting example, and in reference to the accompanying drawings, where:
FIGS. 4-61 show examples of the method.

DETAILED DESCRIPTION OF THE INVENTION

A description of example embodiments of the invention follows.

The teachings of all patents, published applications and references cited herein are incorporated by reference in their entirety.

Figure 1:
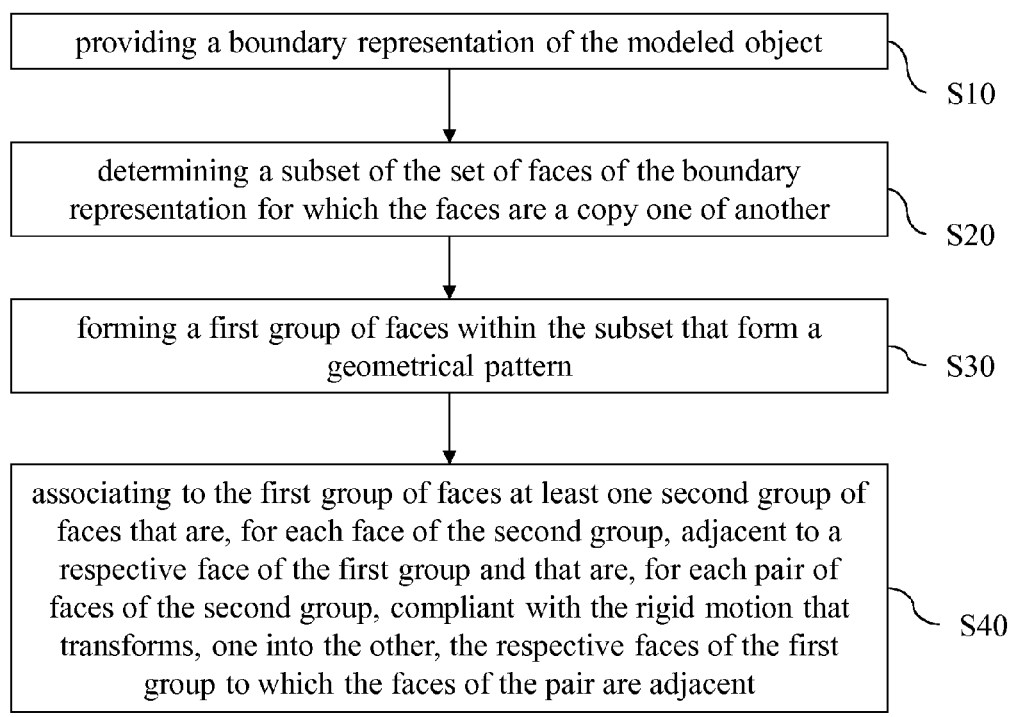
FIG. 1 shows a flowchart of an example of the method.

FIG. 1 shows a flowchart of the computer-implemented method for designing a 3D modeled object. The method comprises providing S10 a boundary representation of the modeled object. The boundary representation comprises a set of faces. Each face is defined as a bounded portion of a respective supporting surface. The method also comprises determining S20 a subset of the set of faces of the boundary representation, for which the faces are a copy one of another. The method also comprises forming S30 a first group of faces within the subset that form a geometrical pattern. And the method comprises associating S40 to the first group of faces at least one second group of faces. The faces of the second group are, for each face of the second group, adjacent to a respective face of the first group. And the faces of the second group are, for each pair of faces of the second group, compliant with the rigid motion that transforms, one into the other, the respective faces of the first group to which the faces of the pair are adjacent.

Such a method constitutes an improved solution for designing a 3D modeled object. By forming S30 a first group of faces that form a geometrical pattern, the method identifies a geometrical pattern and thereby opens pattern-based designing functionalities to the user. By associating S40 to the first group of faces at least one second group of faces in the specific way of the method, the method allows an adequate extension of the identified pattern, to better grasp intended patterns and facilitate design even more. Because the method works at the face level and involves the identification of characteristics related to faces such as faces being a copy of each other and compliance of pairs of faces with given rigid motions, the method may be easily implemented and thus automatized, and thereby identify meaningful patterns in an exhaustive and fast way. This is all detailed in the following discussions.

A modeled object is any object defined by data stored in a memory of a computer system. By extension, the expression "modeled object" designates the data itself "Designing a 3D modeled object" designates any action or series of actions which is at least part of a process of elaborating a 3D modeled object. Thus, the method may comprise creating the 3D modeled object from scratch. Alternatively, the method may comprise providing a 3D modeled object previously created, and then modifying the 3D modeled object.

The 3D modeled object may be a CAD modeled object or a part of a CAD modeled object. In any case, the 3D modeled object designed by the method may represent the CAD modeled object or at least part of it, e.g. a 3D space occupied by the CAD modeled object. A CAD modeled object is any object defined by data stored in a memory of a CAD system. According to the type of the system, the modeled objects may be defined by different kinds of data. A CAD system is any system suitable at least for designing a modeled object on the basis of a graphical representation of the modeled object, such as CATIA. Thus, the data defining a CAD modeled object comprise data allowing the representation of the modeled object (e.g. geometric data, for example including relative positions in space).

The method may be included in a manufacturing process, which may comprise, after performing the method, producing a physical product corresponding to the modeled object, e.g. according to the geometrical pattern(s) recognized by the method (in such a case, the manufacturing process is fed with information on said geometrical pattern(s)). In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process. The method can be implemented using a CAM system, such as DELMIA. A CAM system is any system suitable at least for defining, simulating and controlling manufacturing processes and operations.

The method is computer-implemented. This means that the method is executed on at least one computer, or any system alike. For example, the method may be implemented on a CAD system. Thus, steps of the method are performed by the computer, possibly fully automatically, or, semi-automatically (e.g. steps which are triggered by the user and/or steps which involve user-interaction). Notably, the providing S10 and/or the determining S20 may be triggered by the user. The forming S30 and/or the associating S40 may be performed automatically (i.e. without any user intervention), or semi-automatically (i.e. involving—e.g. light-user-intervention, for example for validating the result or adding/deleting user-determined elements to/from the groups).

A typical example of computer-implementation of the method is to perform the method with a system suitable for this purpose. The system may comprise a memory having recorded thereon instructions for performing the method. In other words, software is already ready on the memory for immediate use. The system is thus suitable for performing the method without installing any other software. Such a system may also comprise at least one processor coupled with the memory for executing the instructions. In other words, the system comprises instructions coded on a memory coupled to the processor, the instructions providing means for performing the method. Such a system is an efficient tool for designing a 3D modeled object.

Such a system may be a CAD system. The system may also be a CAE and/or CAM system, and the CAD modeled object may also be a CAE modeled object and/or a CAM modeled object. Indeed, CAD, CAE and CAM systems are not exclusive one of the other, as a modeled object may be defined by data corresponding to any combination of these systems.

The system may comprise at least one GUI for launching execution of the instructions, for example by the user. Notably, the GUI may allow the user to trigger the step of providing S10, and then, if the user decides to do so, e.g. by launching a specific function (e.g. entitled "pattern recognition"), to trigger the determining S20. The forming S30 and then the associating S40 may then be performed automatically or semi-automatically.

The 3D modeled object is 3D (i.e. three-dimensional). This means that the modeled object is defined by data allowing its 3D representation. Notably, the faces of the B-Rep are 3D and the supporting surfaces are 3D surfaces (i.e. they are defined in 3D, such that the union of all supporting surfaces may be non-planar). A 3D representation allows the viewing of the representation from all angles. For example, the modeled object, when 3D represented, may be handled and turned around any of its axes, or around any axis in the screen on which the representation is displayed. This notably excludes 2D icons, which are not 3D modeled, even when they represent something in a 2D perspective. The display of a 3D representation facilitates design (i.e. increases the speed at which designers statistically accomplish their task). This speeds up the manufacturing process in the industry, as the design of the products is part of the manufacturing process. It is noted that the discussion concerning the 3D character of the method holds true, even though some examples on the figures are represent in 2D. It has to be understood that these examples are for the purpose of understanding the method.

Figure 2:
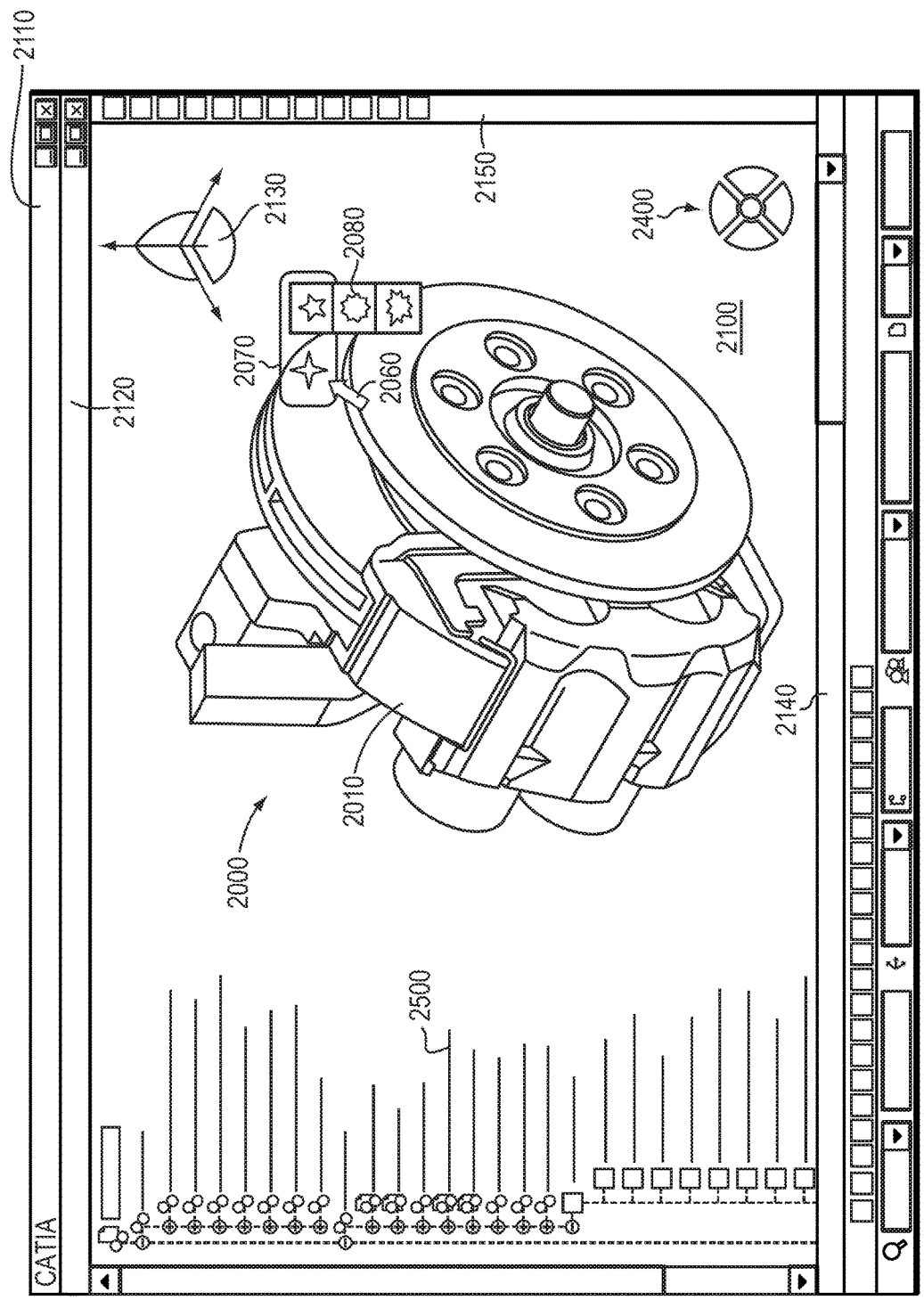
FIG. 2 shows an example of a graphical user interface.

FIG. 2 shows an example of the GUI of a typical CAD system.

The GUI 2100 may be a typical CAD-like interface, having standard menu bars 2110, 2120, as well as bottom and side toolbars 2140, 2150. Such menu and toolbars contain a set of user-selectable icons, each icon being associated with one or more operations or functions, as known in the art. Some of these icons are associated with software tools, adapted for editing and/or working on the 3D modeled object 2000 displayed in the GUI 2100. The software tools may be grouped into workbenches. Each workbench comprises a subset of software tools. In particular, one of the workbenches is an edition workbench, suitable for editing geometrical features of the modeled product 2000. In operation, a designer may for example pre-select a part of the object 2000 and then initiate an operation (e.g. a sculpting operation, or any other operation such change the dimension, color, etc.) or edit geometrical constraints by selecting an appropriate icon. For example, typical CAD operations are the modeling of the punching or the folding of the 3D modeled object displayed on the screen.

The GUI may for example display data 2500 related to the displayed product 2000. In the example of FIG. 2, the data 2500, displayed as a "feature tree", and their 3D representation 2000 pertain to a brake assembly including brake caliper and disc. The GUI may further show various types of graphic tools 2130, 2070, 2080 for example for facilitating 3D orientation of the object, for triggering a simulation of an operation of an edited product or render various attributes of the displayed product 2000. A cursor 2060 may be controlled by a haptic device to allow the user to interact with the graphic tools.

Figure 3:
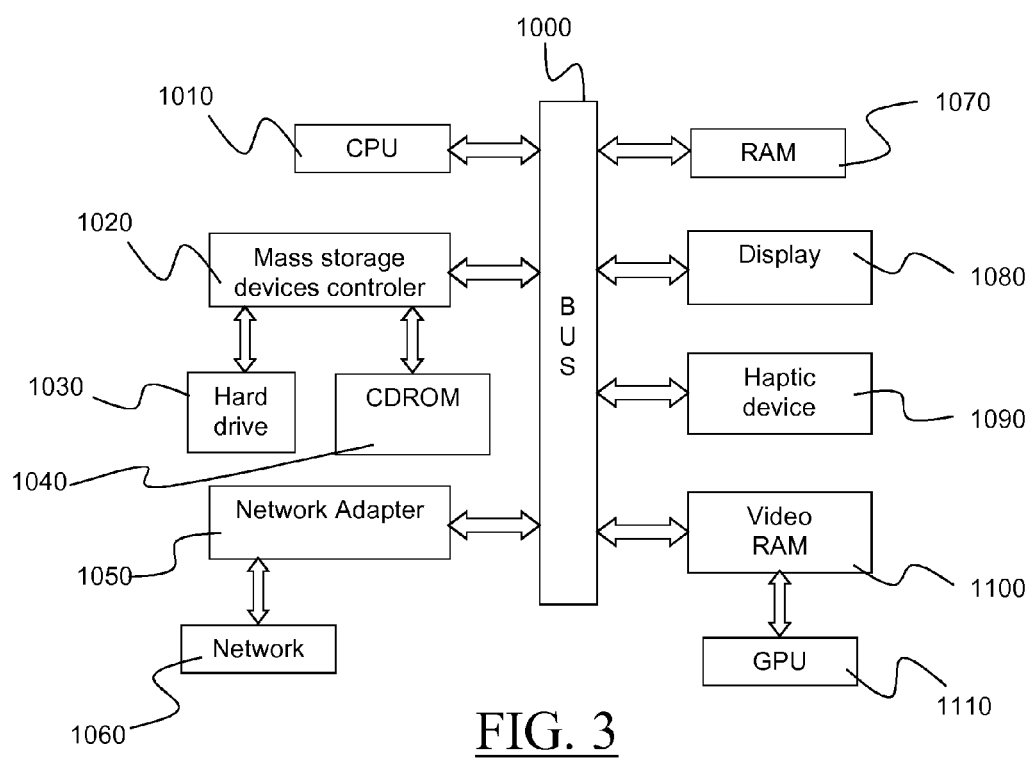
FIG. 3 shows an example of a client computer system.

FIG. 3 shows an example of the architecture of the system as a client computer system, e.g. a workstation of a user.

The client computer comprises a central processing unit (CPU) 1010 connected to an internal communication BUS 1000, a random access memory (RAM) 1070 also connected to the BUS. The client computer is further provided with a graphics processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks, magneto-optical disks, and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on screen 1080, as mentioned with reference to FIG. 2. By screen, it is meant any support on which displaying may be performed, such as a computer monitor. In addition, the cursor control device allows the user to select various commands, and input control signals. The cursor control device includes a number of signal generation devices for input control signals to system. Typically, a cursor control device may be a mouse, the button of the mouse being used to generate the signals.

To cause the system to perform the method, it is provided a computer program comprising instructions for execution by a computer, the instructions comprising means for this purpose. The program may for example be implemented in digital electronic circuitry, or in computer hardware, firmware, software, or in combinations of them. Apparatus of the invention may be implemented in a computer program product tangibly embodied in a machine-readable storage device for execution by a programmable processor; and method steps of the invention may be performed by a programmable processor executing a program of instructions to perform functions of the invention by operating on input data and generating output. The instructions may advantageously be implemented in one or more computer programs that are executable on a programmable system including at least one programmable processor coupled to receive data and instructions from, and to transmit data and instructions to, a data storage system, at least one input device, and at least one output device. The application program may be implemented in a high-level procedural or object-oriented programming language, or in assembly or machine language if desired; and in any case, the language may be a compiled or interpreted language. The program may be a full installation program, or an update program. In the latter case, the program updates an existing CAD system to a state wherein the system is suitable for performing the method.

The providing S10 is now discussed.

The method comprises providing S10 a B-Rep of the modeled object. The providing S10 may result from a designer working on a modeled object (in this case on its boundary representation), or from the fact that the method may be applied to already existing B-Reps, e.g. retrieved in existing libraries. The modeled object is in any case provided at S10 as a B-Rep. The boundary representation is a widely known format for modeling a 3D object in terms of its envelop (i.e. its outer surfaces). The B-Rep thus designates data of a specific format that may comprise geometrical data and topological data. Geometrical data are data that provide geometrical entities, which are entities described in terms of 3D positions. Topological data are data that provide topological entities, which are entities described in terms of references to geometrical entities and/or relationships with other topological entities, e.g. relative positioning. Typically, the relationships may include an "is bounded by" relationship that associates a topological entity to other topological entities by which they are topologically bounded.

The providing S10 may exclude any history data. In other words, the modeled object provided at S10 may be history-free. This means that the modeled object is not associated to any data indicating the history of its design, but only by declarative data, including the B-Rep. Thus, the method works within a context where the designer is not in possession of the history of the modeled object, which notably implies that geometrical patterns designed on the modeled object are not defined as such on the modeled object provided at S10.

In the case of the method, the (e.g. geometrical) data include at least so-called "supporting surfaces", for example parametric surfaces (i.e. 3D surfaces modeled in terms of 3D positions associated to parameters defining a 2D domain). The supporting surfaces may typically be Nurbs surfaces, but also planar, canonical or procedural surfaces. And the (e.g. topological) data include at least a set of faces, each face being defined as a bounded portion of a respective supporting surface (provided in the geometrical data). Thus, a face corresponds to a trimmed surface. The supporting surfaces are thus surfaces on which the faces are defined (thereby "supporting" the faces), in any way, by a trimming operation.

The notion of B-Rep, although widely known, is now further discussed through an example of a modeled object that may be provided at S10. Other examples of B-Reps, for example with relationships different from the "is bounded by" relationship, for at least some topological entities, may however be contemplated by the method.

As already mentioned, a B-Rep of a modeled object may include topological entities and geometrical entities. The geometrical entities may comprise 3D objects that are surfaces (e.g. planes), curves (e.g. lines) and/or points. Surfaces may be provided as functions of two parameters. Curves may simply be provided as functions of one parameter. And points may be provided as 3D positions. The topological entities may comprise faces, edges, and/or vertices. By its definition, a face corresponds to a bounded portion of a respective surface, named the supporting surface. The term "face" may thus indifferently designate such bounded portion of the surface or the corresponding bounded portion of the 2D domain. Similarly, an edge corresponds to a bounded portion of a curve, named e.g. the supporting curve. The term "edge" may thus designate such bounded portion of the curve or of its domain. A vertex may be defined as a link to a point in 3D space. These entities are related to each other as follows. The bounded portion of a curve is defined by two points (the vertices) lying on the curve. The bounded portion of a surface is defined by its boundary, this boundary being a set of edges lying on the surface. Edges of the face's boundary are connected together by sharing vertices. Faces are connected together by sharing edges. By definition, two faces are adjacent if they share an edge. Similarly, two edges are adjacent if they share a vertex. Surfaces, curves, and points may be linked together via their parameterization. For example, a value of the parameter of the parametric function defining a curve may be provided to define a bounding vertex. Similarly, a function linking the parameter of a curve to the two parameters of a surface may be provided to define a bounding edge. However, the very detailed structure of such topological data of a B-Rep is out of the scope of the present explanations.

FIGS. 4 and 5 illustrate the B-rep model of a cylindrical slot 80 that may be the modeled object provided at S10 and that is made of three faces numbered 1, 2 and 3 on the figures: top planar face 1 and two lateral cylindrical faces 2 and 3. FIG. 4 shows a perspective view of slot 80. FIG. 5 shows the exploded view of all faces. Duplicated numbers illustrate edges and vertices sharing. Face 1 is a bounded portion of a plane. Boundary of face 1 includes edges 4 and 5, each of them being bounded by vertices 10 and 11. They both have the same supporting circle. Face 2 is bounded by edges 6, 8, 5 and 13 all lying on an infinite cylindrical surface (i.e. the supporting surface of face 2). Faces 1 and 2 are adjacent because they share edge 5. Faces 2 and 3 are adjacent because they share edges 8 and 13. Faces 1 and 3 are adjacent because they share edge 4.

FIG. 6 illustrates the "is bounded by" topological relationship of the B-rep model of slot 80. Nodes of higher layer 101 are faces, nodes of intermediate layer 103 are edges and nodes of lower layer 105 are vertices. FIGS. 7 and 8 illustrate the relationship between topological entities (faces, edges, vertices) and the supporting geometries (infinite cylinder, infinite plane, infinite line, points). In the CAD system, the B-rep model gathers in an appropriate data structure the "is bounded by" relationship and the relationship between topological entities and supporting geometries, and mathematical descriptions of supporting geometries. In other words, the data structures shown on FIGS. 6 and 7 are part of the topological data of this example, which comprise links to geometrical entities of the geometrical data (this is FIG. 7) and links between topological entities (this is FIG. 6).

Other actions (i.e. steps S20-S40) of the method are now discussed.

The method comprises, e.g. upon user triggering, the determining S20 of a subset of the set of faces of the boundary representation for which the faces are a copy one of another. The subset of faces is consequently a set of faces that are copies one of each other, or, in other words, geometrically identical one to each other, or geometric replicas one of the other. The subset may be determined at S20 according to any implementation desired by the skilled person. For example, the method may comprise performing comparisons between pairs of faces, the faces being browsed according to any order. Such comparisons may be performed in any way. Examples are provided later. Also, as known from the field of CAD, any determination involving numerical computations is subject to the necessary numerical approximations applied by the system. In the present case, faces may be determined at S20 to be a copy of each other although they are in theory slightly different. Thus, the method may actually determine at S20 a subset of faces that are substantially a copy one of another. However, the way the approximations are implemented is not the subject of the present discussion, such that "substantially a copy one of another" and "a copy one of another" are not distinguished in the following. It is indeed only considered that the method follows a predetermined criterion for telling if two faces are a copy one of another.

The method then comprises forming S30 a first group of faces within the subset that form a geometrical pattern. The first group of faces, called "first" for the sake of convenience, is, when formed at S30, a set of faces of the subset, and thus a set of faces that are a copy one of another. By "forming" a group, it is meant that data is added to the modeled object in order to indicate the existence of said group. For example, a group name is created and links between the faces of the group and the group name are added to the (data defining the) modeled object. This way of linking elements together may also be implemented for the determining S20, although in the case of the forming S30, the forming of the group implies new data stored on persistent memory or at least long enough for the user to work on the geometrical pattern, whereas this not necessarily the case for the new data indicating the subset created in the determining S20, this new data being created mainly for the purpose of performing the forming S30. These are just matters of implementation known to the skilled person.

Moreover, the method selects the faces to form the first group such that they form a geometrical pattern. The expression "geometrical pattern" means that the faces of the first group constitute geometry of whose elements (i.e. the faces or sets of faces of the first group) are positioned in a predictable manner, i.e. according to predetermined rules, thereby excluding complete randomness. By forming S30 a group of faces that form a geometrical pattern, the method starts recognition of a geometrical pattern within the modeled object. Because the faces of the geometrical pattern are first selected to be copies one of another, the method recognizes geometrical patterns that have a meaning according to design intent. This allows easier designing. First of all, this allows the later presentation to the user of the geometrical pattern. The user may thus grasp intent of the designer. This also allows later design actions performed globally on the geometrical pattern (i.e. in an automatically unified way), as mentioned earlier. For example, the user may translate the whole geometrical pattern with a single "drag and drop" action. Or, the user may increase the size of all the elements of the geometrical pattern by selecting the pattern and then entering the new size for its elements only once. These are only examples. The method may comprise any or several of such later design actions. This is useful in the field of CAD in general, since the method allows achieving some specific designs involving geometrical patterns with less user actions. This is particularly useful in the field of mechanical design, when the modeled object represents a product, the method belonging in such a case to a global industrial process necessitating time optimization of all its phases. The method may also comprise feeding a manufacturing process with the recognized geometrical patter.

The forming S30 may comprise testing whether an occurrence of one of a predetermined set of geometrical patterns is present within the subset. In other words, the method is based on a predetermined set of types of geometrical patterns, possibly pre-determined or user-defined, e.g. stored on persistent memory, and for the forming S30, the method tests whether the subset determined at S20 comprises faces that respect/constitute a geometrical pattern that belongs to the predetermined set. Working on such a predetermined set allows making the method as efficient as possible according to any field of design contemplated. Notably, the predetermined set may be modifiable. The predetermined set may comprise 2D patterns (i.e. planar layouts) and/or 3D patterns (i.e. non-planar distribution).

The predetermined set of geometrical patterns may include a set of recurrently defined patterns. These patterns are often used in the field of mechanical design, and as a consequence their recognition is particularly useful. A recurrently defined pattern is a pattern defined by one or several initial geometrical elements, e.g. faces, e.g. one or two initial faces, and by one or several rules for generating other elements from the initial elements and/or from previously generated elements. Any recurrently defined pattern may be regular, when the rules are defined globally and not attached to a specific index of recurrence (the rules are defined for general indices, e.g. n, or 2n and 2n+1, or 3n and 3n+1 and 3n+2, i.e. not for specific values). Thus, for forming S30 the first group, the method may comprise testing within the subset determined at S20 if there is a set of faces that may have been generated according to the rules corresponding to a considered geometrical pattern. This may be repeated several times, by browsing the patterns of the predetermined set of patterns. In other words, the method may comprise, according to the geometrical pattern under testing, defining one or several faces (depending on whether the pattern has one or several initial elements), and then checking if an occurrence of the geometrical pattern is present from applying the pattern rules to the defined initial faces. Examples of recurrently defined patterns and ways of testing occurrences thereof are provided later.

Whatever the geometrical pattern recognized and whatever the process used for that when forming the first group at S30, the method then comprises associating S40 to the first group of faces a so-called "second group" of faces. In other words, new data is created at S40 just like at S30, this new data comprising links between the first group and other faces of the B-Rep not already in the first group. Thus, the associating S40 "extends" the recognized geometrical pattern to new faces. The expression "geometrical pattern" may thus designate this extended version of the initial geometrical pattern in the following. In the following, any geometrical pattern recognized by the method thus comprises at least "first group" faces, that are copies one of another, and "second group" faces that respect certain constraints as explained below.

The second group of faces is a set of faces that is a subset of the whole set of faces of the B-Rep provided at S10. The faces of the second group have the specificity/constraint that they are, for each face of the second group, adjacent to a respective face of the first group. In other words, each face of the second group shares an edge with a face of the first group. This first group face is designed as "the 'respective' first group face" to indicate its relation with its adjacent second group face in the following. Another specificity/constraint of the faces of the second group is that they are, for each pair of faces of the second group, compliant with a specific rigid motion. A face may be seen as a point-set (and thereby handled as such by the method), i.e. a subset of the three-dimensional space $\mathbb{R}^3$. A rigid motion is a mapping D: $\mathbb{R}^3 \rightarrow \mathbb{R}^3$ defined between two point-sets by $D(x)=Rx+T$ where R is a rotation and T is a translation vector (possibly null). A rigid motion is invertible since $y=D(x)$ is equivalent to $x=D^{-1}(y)$ where $D^{-1}(y)=R^{-1}y-R^{-1}T$. As the faces of the first group are a copy one of another, given two faces of the first group, one may be derived from the other one by applying a rigid motion. Now, for adjacent faces to be part of the faces associated to the first group at S40, the method requires them to be two-by-two compliant with the rigid motion that transforms their respective first group's adjacent faces one into the other. This may mean that such a rigid motion is used, e.g. in a specific test implemented by the method, to determine if faces adjacent to the first group's faces may be added to the second group or not.

The notion of compliancy means that that the faces of the second group are geometrically linked two-by-two via said specific respective rigid motions, although they may be not necessarily be derivable one from the other with said specific respective rigid motions (i.e. the criterion is "looser" in such a case than the "is a copy of" criterion). This may be implemented in any way contemplated by the skilled person. For example, the method may evaluate a pair of faces to be compliant with the specific rigid motion (i.e. the rigid motion that transforms, one into the other, respective faces of the first group to which the faces of the pair are adjacent) when the rigid motion also transforms, one into the other, the supporting surfaces respective to the faces of the pair, at least in an area of adjacency of the faces of the pair to the respective faces of the first group. The area of adjacency may actually be a predetermined neighborhood of the adjacency edge on the faces of the second group (i.e. the edge shared by the two adjacent faces). The size of the neighborhood may be defined in any way contemplated by the skilled person. It can be limited to a part of the respective support surfaces. The method may then evaluate if the supporting surfaces are a copy one of the other in such a neighborhood via the rigid motion that transforms one respective first group's face into the other. Another example is to evaluate if (only) the adjacency edges are a copy one of the other via the rigid motion that transforms one first group's face into the other (this is not necessarily the case even though the first group's faces are a copy one of the other, since some information on surface derivatives may be attached to the adjacency edges, e.g. as discussed later, local axis systems attached to the potential second group faces bounded by the edges). Alternatively, the method may evaluate the pair of faces to be compliant with the specific rigid motion if the rigid motion also transforms, one into the other, the whole respective supporting surfaces. In any case, the loosening of the geometrical comparison criterion for the associating S40 (compared to the forming S30) allows a more frequent extension of the geometrical pattern, taking advantage of information already present that a geometrical pattern has already been determined to exist at S30 based on a stricter criterion. Also, the result is easier to handle by the user (as the user may for example then delete some elements of the geometrical pattern associated at S40 if they appear to him as not being part of the geometrical pattern, which easier to do than adding new elements which would appear to him as having been forgotten).

Thus, by performing simple geometrical computations based on face definitions, and by identifying a first group of faces that are copies one of another and that form a geometrical pattern, and then by adequately extending the first group with adjacent faces, the method efficiently identifies geometrical patterns that may be complex (more elaborate than patterns of only one face each time), without the need that the user identifies (i.e. pre-selects) any specific face or position on the modeled object for helping the identification. The method may actually exclude such identification made by the user. Thus, the method allows an efficient identification of patterns adapted to the boundary representation of a modeled object. The method does not require any user's visual analysis of the geometry. The method concentrates on arrangements of duplicated geometries by systematically analyzing the input geometry. Since the user is not directly involved in the process, time is saved for other tasks. Furthermore, as explained later the method may be used to yield all arrangements of duplicated geometries as a final result. This is a one shot process. Consequently, the invention shortens the time spent for pattern recognition and provides the best possible result.

Now, it is noted that the method may be iterated. The iteration is performed such that the faces included in the first group at S30 or associated to the first group at S40 in an iteration are discarded for the next iterations. Notably, the method may comprise one initial providing S10 as explained above (the B-Rep being actually initially provided but then present at least until the end of the method). Then the method may comprise the user performing a triggering step, to launch pattern recognition. The method may then, e.g.

automatically (i.e. without any user-intervention), iterate the determining S20, the forming S30 and the associating S40, until all patterns are recognized (all patterns recognizable by the method). In each iteration, any face that is "used" (including faces that are part of the faces forming the first group and faces that are associated to the second group, but also faces belonging to the so-called "blocks of faces" discussed later) may be put aside (i.e. discarded) so that it is not used in the next iterations. This is to keep the pattern recognition simple, and have a given face belonging to one geometrical pattern at most.

Thanks to such iteration, the method may recognize geometrical patterns that are elaborate/fine enough in an exhaustive way with minimal user-intervention. It is noted here that the first determining S20 may determine all subset of faces that are copies one of another, the determining S20 of each iteration consisting then of a selection among these initially determined subsets. The initially subsets may be modified according to the iterations of the other actions of the method, as described later with reference to examples of the method. It is also noted that it is possible to alternate steps S30 and S40 of the method one iteration to another, or alternatively to perform several iterations of the forming S30 and then only several iterations of the associating S40. The precise ordering in which the steps of the method are iterated is not essential to the exhaustiveness of the pattern recognition. Examples of the way of how to perform the steps of the method at each iteration are provided later. Any variation implementable by the skilled person is in the scope if the present discussion.

The method thus allows automatically finding all copies of geometric features within the input object, as well as respective arrangements of all these copies. This task is performed on an input object, typically the B-Rep of a solid, without any user selection. The algorithm outputs as many patterns as necessary to describe all replicated features. In an example, the method first considers the input solid as a set of independent faces. In the first step of the example, faces that are identical modulo a rigid motion are gathered into subsets. This yields a partition of the initial set of faces into disjoint subsets. Roughly speaking, given any two faces a, b in the same subset, there exists a rigid motion D such that b=D (a). In the second step of the example, within each subset of faces, the algorithm identifies all characteristic patterns. As described in the examples provided later, a one dimensional pattern is a linear or circular sequence of equally spaced objects, a two dimensional pattern is a rectangular grid or a concentric and circular arrangement. The third step of the example is to extend patterned features.

Examples of the method are now discussed, after providing some definitions.

Given a point-set X, a point-set Y is a "replica" of X if there exists a rigid motion D such that $Y=\{D(x), x \in X\}$, which is noted $Y=D(X)$ in short.

An "oriented point-set" is a couple $(X, u_x)$ where $X \subset \mathbb{R}^3$ is a point-set and $u_x$ is a mapping $u_x: X \rightarrow S^2$ where $S^2$ is the set of unit vectors of $\mathbb{R}^3$. In other words, at any point $x \in X$, a unit vector $u_x(x)$ is defined.

An oriented point-set $(Y, U_y)$ is a "copy" of an oriented point-set $(X, u_x)$ if Y is a replica of X that saves the orientation. More precisely, for all $x \in X$, the unit vector of the corresponding point D(x) on the replica is the rotated unit vector of X at point x. Formally, for all $x \in X$, $u_y(D(x))=Ru_x(x)$, meaning that the following diagram is commutative.

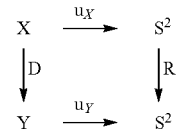

The relation "is a copy" on point-sets, on which the determining S20 relies, is an equivalence relation. To prove that, it is enough to check the following properties, which is not difficult: (1) a point-set is a copy of itself, (2) if Y is a copy of X then X is a copy of Y and (3) if Y is a copy of X and Z is a copy of Y, then Z is a copy of X.

According to basic algebra, given a finite set G of point-sets (meaning that elements of G are point-sets) the equivalence relation "is a copy" separates G into disjoint and maximal subsets $G_i$ of copies. This means that $G_i \cap G_1 = \emptyset$ if $i \neq j$, that $G = \cup_i G_i$, that if X, $Y \in G_i$ then Y is a copy of X and that if $X \in G_i$ and $Y \notin G_i$ then Y is not a copy of X. The subsets $G_i$ are in fact "classes" of point-sets by reference to the equivalence classes of an equivalence relation.

The previous theory applies (but is not restricted) to the faces of a solid (i.e. the modeled object in the example is a solid). Faces play the role of point-sets and the solid's B-Rep is the set G. In other words, to implement the determining S20, the skilled person may represent the faces as point-sets and the B-Rep provided at S10 as a set G as defined above.

An example of the determining S20 is now discussed.

Given a modeled object e.g. that represents a solid, the B-Rep of said solid provided at S10 is considered as a set of independent faces. Meaning that $G=\{f_1, \ldots, f_n\}$ where $f_i$ is the i-th face of the solid. The very first step is to compute (i.e. the determining S20) subsets of G according to the "is a copy" relation. The overall algorithm is as follows.

```
For i := 1 to n do begin
    If f_i is not already used in a subset then
        Create a new subset G_i := {f_i}
        For j := i + 1 to n do begin
            If f_j is not already used in a subset then
                If f_j is a copy of f_i then
                    G_i := G_i ∪ {f_j}
                    Store the rigid motion that
                    changes f_i into f_j
                End if
            End if
        End for
    End if
End for
```

As can be seen, all subsets of copies are thus determined at the beginning, with possible modifications of the determined subsets as explained later.

An example of how to implement the "is a copy" relation for faces is now discussed.

As explained earlier, a face of a solid is defined by a supporting surface (e.g. a plane) and by boundary edges. In an example, the face is equipped with the outer normal vector of the solid. The boundary edges are oriented according to this normal vector. Boundary edges are connected by sharing vertices.

In order to perform comparison and to find the rigid motions, each face is equipped with several axis systems. At each vertex v of the face, an axis system is created as follows. The coordinates of the origin point P are the coordinates of the vertex v. First vector, noted U, is tangent to the input boundary edge of v and such that −U is oriented like the boundary edge. Second vector, noted V, is tangent to the output boundary edge of v and is oriented in the boundary edge direction. Words "input" and "output" are related to the topological orientation of the boundary edges according to the normal vector of the face. The third vector is the outer normal vector N of the face computed at vertex v. Despite N is always perpendicular to U and to V, it should be noticed that the axis system (P, U, V, N) is not generally direct and orthogonal.

FIGS. 9-11 illustrate the axis systems of a semi-cylindrical face 90. FIG. 9 shows face 90 and its normal vector 92. FIG. 10 shows the topological orientation of boundary edges 94 induced by normal vector 92. Boundary edge a is an input edge of vertex v. Boundary edge b is an output edge of vertex v. FIG. 11 displays vectors U, V, N of axis systems at each boundary vertex.

Now, the method may, in an example, within the determining S20, determine if two faces are copies one of another by searching the rigid motion between them, if any. Let f, g be two faces respectively equipped with (the same number of) local axis systems $S_1^f, \ldots, S_m^f$ and $S_1^g, \ldots, S_m^g$. If faces f, g do not have the same number of local axis systems, it means that they do not have the same number of boundary vertices, so they are determined not to be copies of each other and the rigid motion search is not launched.

The first step is to compute the rigid motions $D_{i,j}$ respectively changing the i-th axis system of face f into the j-th axis system of face g. Since i,j=1, . . . , m, there exists at most $m^2$ such rigid motions. Formally, rigid motions are such that $D_{i,j}(S_i^f)=S_j^g$. Noting $S_i^f=(P_i^f, U_i^f, V_i^f, N_i^f)$, $S_j^g=(P_j^g, U_j^g, V_j^g, N_j^g)$ and $D_{i,j}(x)=R_{i,j}x+T_{i,j}$ this is achieved by first solving the following linear system, keeping in mind that the unknowns are the coefficients of matrix $R_{i,j}$ and coordinates of vector $T_{i,j}$.

$R_{i,j}U_i^f=U_j^g$ $R_{i,j}V_i^f=V_j^g$ $R_{i,j}N_i^f=N_j^g$ $T_{i,j}-R_{i,j}P_i^f=P_j^g$

Secondly, to insure that matrix $R_{i,j}$ is a rotation, the two following conditions must be checked.

$R_{i,j}R_{i,j}^T=I$ $det(R_{i,j})=1$

Otherwise, $D_{i,j}$ is not a rigid motion because $R_{i,j}$ is not a rotation.

Then, the rigid motion D* that changes f into g, if any, is to be found among the previously computed $D_{i,j}$. The problem is now to answer the question: given f,g and a rigid motion D, is D (f)=g true? This may be done by sampling face f with a collection of 3D points $x_k$, k=1, . . . , q and by checking that the distances between points $D(x_k)$ and face g are small enough compared to a predetermined numerical threshold for identical objects. If, among the $D_{i,j}$, several rigid motions can change f into g, then a pure translation is selected when possible. This is an efficient way of performing the determining S20, leading to results compliant with user intent.

An example of the data structure for the subsets determined at iterations of S20 is now discussed.

The rigid motions and related point-sets may be stored in an appropriate data structure, now discussed, in order to retrieve copies of a given point-set (corresponding to a given face) and the associated rigid motions. Conceptually, this data structure includes a directed graph W=(P, A, α, ω) where nodes P are point-sets and arcs A are labeled with rigid motions. The labeling is a mapping m: A→SE(3) where SE(3) is the group of three-dimensional rigid motions. More precisely, writing that arc u∈A starts at node α(u)=x∈P and ends at node ω(u)=y∈P means that point-sets x and y are copies of each other and that the rigid motion m (u) changes x into y, which is noted: y=m(u)x. Now, suppose that arc v∈A connects x et z∈P, which is written α(v)=x and ω(v)=z. The rigid motion that changes x into z is z=m(v)x. Then, z is also a copy of y and the rigid motion that changes y into z is $z=m(v)m(u)^{-1}y$. Conversely, the rigid motion that changes z into y is $y=m(u)m(v)^{-1}z$. This information may be all captured by the data structure.

By nature, the algorithm computing initial subsets creates a graph made of depth-1 tree graphs, each of them being a subset. By definition, a depth-1 tree is a tree graph featuring one node with no input arc (the root node) and all other nodes with no output arc nodes (leaf nodes). In other words, all non-root nodes are connected to the root node. Consequently, given any two nodes within a depth-1 tree graph, there exists only one path of arcs joining them, and this unique path includes only two arcs.

FIGS. 12-13 illustrate the graph data structure resulting from the algorithm computing initial subsets (the determining S20). FIG. 12 illustrates a B-Rep 120 of a modeled object consisting of four aligned cylindrical slots, with faces numbered from 1 to 12. They are numbered according to some arbitrary storage in the topological data structure. FIG. 13 illustrates the graph 130, including two depth-1 trees 132.

Accordingly, the rigid motion that changes one point-set into any other point-set is computed by combining rigid motions along the path of arcs joining the two said point-sets. Since this path includes two arcs, only two rigid motions are combined. This facility of computing the rigid motion relating to any two point-sets within a subset is widely used in this example of the method.

Examples of the forming S30 are now discussed. In these examples, forming S30 the first group of faces within the subset comprises testing whether an occurrence of one of a predetermined set of geometrical patterns is present within the subset. Examples of the testing and of the consequent actions are provided for a predetermined set of geometrical patterns that includes a set of recurrently defined patterns. More specifically, the set of recurrently defined patterns of the example includes one-dimensional patterns including a linear pattern and/or a circular pattern, and a grid patterns including a rectangular grid pattern and/or a circular grid pattern. This structure is particularly well-adapted to mechanical design, where these patterns often occur. Performing the forming S30 on the basis of a set comprising all these four patterns (i.e. the predetermined set of geometrical patterns includes, a circular grid pattern, a rectangular grid pattern, a circular pattern, and a linear pattern) thus allows grasping most intended patterns of mechanical designers. Should the set consist of these four patterns, a good tradeoff with speed of execution of the method is ensured as well.

Definitions and examples of the testing and of the consequent actions are now provided for each of these patterns.

Given a set G of point-sets, let H⊂G be a subset of G determined at S20. This means that all elements of H are copies of each other.

A one dimensional pattern of H is a couple (H', D) where $H'=\{h_1, \ldots, h_p\}$ is a set included in H and where D is a rigid motion such that $h_{i+1}=D(h_i)$ for i=1, . . . , p−1.

A linear pattern is a one dimensional pattern where the rigid motion D is a translation, as illustrated on FIG. 14, which shows a linear pattern formed by semi-cylinder faces 140 that are a copy one of another and that are translated.

A circular pattern is a one dimensional pattern where the rigid motion D is a rotation, as illustrated on FIG. 15, which shows a circular pattern of disk faces 150.

A grid pattern is a 2D layout pattern with two rigid motions that are non-parallel.

A rectangular grid pattern of H is a triple (H', D, B) where H'={$h_{i,j}$; i=1, . . . , p; j=1, . . . , q} is a subset of H such that:

Rigid motions B and D are non collinear translations;

$$h_{1,j+1}=B(h_{1,j}) \text{ for } j=1, \ldots, q-1; \text{ and}$$

$$h_{i+1,j}=D(h_{i,j}) \text{ for } i=1, \ldots, p-1 \text{ and } j=1, \ldots, q.$$

Figure 16:
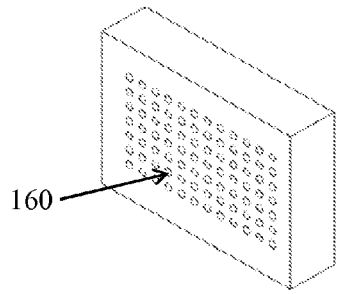

FIG. 16 illustrates a rectangular grid pattern of disk faces 160.

A circular grid pattern of H is a triple (H', R, T) where H'={$h_{i,j}$; i=1, . . . , p; j=1, . . . , q} is a subset of H, where T is a translation and R is a rotation such that:

Translation T is perpendicular to rotation axis of R;

$$h_{1,j+1}=T(h_{1,j}) \text{ for } j=1, \ldots, q-1; \text{ and}$$

$$h_{i+1,j}=R(h_{i,j}) \text{ for } i=1, \ldots, p-1 \text{ and } j=1, \ldots, q.$$

Figure 17:
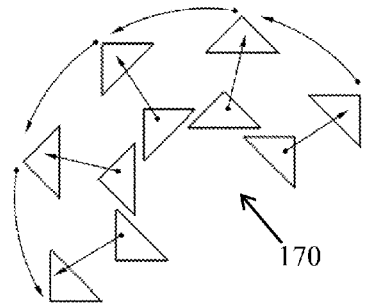

FIG. 17 illustrates a circular grid pattern of triangular faces 170.

In the examples, the forming S30 comprises testing whether an occurrence of one of the above discussed geometrical patterns is present within the subset by trying to form the pattern if possible (this is called "initializing" the pattern), and then extending the pattern within the subset.

An example of the way to initialize a one dimensional pattern is now discussed.

The testing in this example comprises trying to find three elements that form a one dimensional pattern. The algorithm to find the first three elements of a one dimensional pattern is the following. Let H be a subset of point-sets (meaning that the elements h of H are copies of each others). At the beginning of the algorithm, all elements are unused, meaning that they are not yet involved in any pattern. A first given unused element, noted $h_1$, may be selected in any way.

Step (1): Sort all other unused elements in a list L(i), i=1, . . . , n by increasing distance from $h_1$, meaning that, for i=0, . . . , n−1, Dist(L(i+1), $h_1$)≥Dist(L(i), $h_1$).

Step (2): Let $h_2$ be the first element in list L. Let D be the rigid motion such that $h_2=D(h_1)$. Search for another unused element $h_3$ such that $h_3=D(h_2)$. If this $h_3$ exists, the pattern ({$h_1, h_2, h_3$}, D) is initialized, elements $h_1, h_2, h_3$ are used and the algorithm stops.

Step (3): Otherwise, search for another unused element $h_0$ such that $h_1=D(h_0)$. If this $h_0$ exists, the pattern ({$h_0, h_1, h_2$}, D) is initialized, $h_0, h_1, h_2$ are used and the algorithm stops.

Step (4): If no such $h_3$ and $h_0$ elements exist, go to step (2) by taking $h_2$ as the next element in list L. If all elements in list L are visited, no pattern is initialized from $h_1$.

At steps (2) and (3) a translation D initializes a linear pattern; a rotation D initializes a circular pattern.

Figures 18, 19:
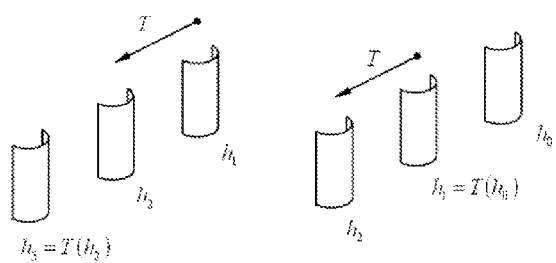

FIGS. 18-19 illustrate a linear pattern initialization.

Figure 20:
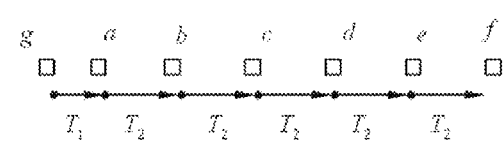

FIG. 20 illustrates why list L is useful. When starting the pattern initialization with element $h_1$=a, list L is L=(g, b, c, d, e, f). The closest element to a is $h_2$=L(1)=g and is such that g=$T_1^{-1}$(a). But, there is no element $h_3$ or $h_0$ such that $h_3=T_1^{-1}$(g) or a=$T_1^{-1}$($h_0$). Then, by considering next element in list L, which is L(2)=b, there exists $h_3$=c such that $h_3=T_2$(b) and the pattern ({a, b, c}, $T_2$) is initialized.

An example of the way to initialize a circular grid pattern is now discussed.

The testing in this example comprises trying to find four elements that form a circular grid pattern. The algorithm to find the first four elements of a circular grid pattern is the following. Let H be a subset of point-sets (meaning that the elements h of H are copies of each others). At initial state, all elements are unused, meaning that they are not yet involved in any pattern. A first given unused element is noted $h_{1,1}$.

Step (1): Sort all other unused elements in a list L(i), i=1, . . . , n by increasing distance from $h_{1,1}$, meaning that Dist(L(i+1), $h_{1,1}$)≥Dist(L(i), $h_{1,1}$) for i=0, . . . , n−1.

Step (2): In list L, search for the first element, noted $h_{2,1}$, such that the rigid motion R changing $h_{1,1}$ into $h_{2,1}$, that is $h_{2,1}=R(h_{1,1})$, is a rotation. If no such $h_{2,1}$ element exists, no circular pattern is initialized from $h_{1,1}$.

Step (3): In list L Search, for the first element, noted $h_{1,2}$, such that the rigid motion T changing $h_{1,1}$ into $h_{1,2}$, that is $h_{1,2}=T(h_{1,1})$, is a translation perpendicular to the axis of rotation R. If no such $h_{1,2}$ element exists, go to step (2) with next element $h_{2,1}$ of list L.

Step (4): Finally, search for another unused element $h_{2,2}$ such that $h_{2,2}=R(h_{1,2})$. If such a $h_{2,2}$ element exists, the pattern ({$h_{i,j}$; i=1, 2; j=1, 2}, R, T) is initialized and $h_{i,j}$; i, j=1,2 are used. If no such $h_{2,2}$ element exists, go to step (3) with next element $h_{1,2}$ of list L.

Figure 21:
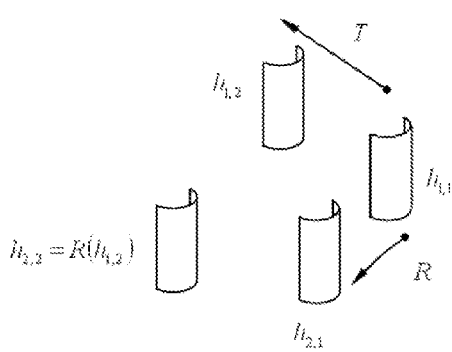

FIG. 21 illustrates a circular grid pattern initialization.

An example of the way to initialize a rectangular grid pattern is now discussed.

The testing in this example comprises trying to find four elements that form a rectangular grid pattern. The algorithm to find the first four elements of a rectangular grid pattern is the following. Let H be a subset of point-sets (meaning that the elements h of H are copies of each others). At initial state, all elements h are unused, meaning that they are not yet involved in any pattern. A first given unused element is noted $h_{1,1}$.

Step (1): Sort all other unused elements in a list L(i), i=1, . . . , n by increasing distance from $h_{1,1}$, meaning that Dist(L(i+1), $h_{1,1}$)≥Dist(L(i), $h_{1,1}$) for i=0, . . . , n−1.

Step (2): In list L, search for the first element, noted $h_{2,1}$, such that the rigid motion D changing $h_{1,1}$ into $h_{2,1}$, that is $h_{2,1}$=D ($h_{1,1}$), is a translation. If no such $h_{2,1}$ element exists, no rectangular pattern is initialized from $h_{1,1}$.

Step (3): In list L, search for the first element, noted $h_{1,2}$, such that the rigid motion B changing $h_{1,1}$ into $h_{1,2}$, that is $h_{1,2}=B(h_{1,1})$, is a translation that is not collinear to translation D. If no such $h_{1,2}$ element exists, go to step (2) with next element $h_{2,1}$ of list L.

Step (4): Finally, search for another unused element $h_{2,2}$ such that $h_{2,2}=D(h_{1,2})$. If such a $h_{2,2}$ element exists, the pattern ({$h_{i,j}$; i=1,2; j=1,2}, D,B) is initialized and $h_{i,j}$; i,j=1,2 are used. If no such $h_{2,2}$ element exists, go to step (3) with next element $h_{1,2}$ of list L.

Figure 22:
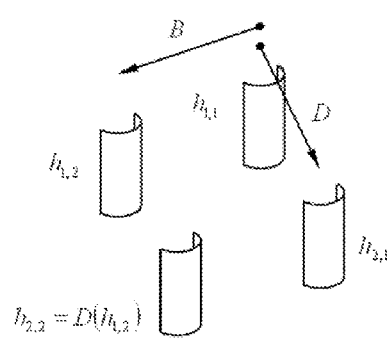

FIG. 22 illustrates a rectangular grid pattern initialization.

An example of the way to extend a one dimensional pattern within the subset determined at S20 during the forming S30 is now discussed.

Given a subset H of point-sets and a pattern P initialized in this subset, the goal is to compute the largest pattern that includes the initial pattern P. Given a one dimensional pattern P=({$h_1, \ldots, h_n$}, D), $h_1$ is named the first element of P and is noted f(P); $h_n$ is named the last element of P and is noted l(P). The extension algorithm includes a forward extension step:

While there exists an unused element h in subset H such that h=D(l(P)) do begin
  Include h in pattern P at last position, meaning l(P):=h
End while
and a backward extension step:
While there exists an unused element h in the subset such that f(P)=D(h) do begin
  Include h in pattern P at first position, meaning f(P):=h
End while At the end of the "while" loops, the maximal one dimensional pattern P is completed within subset H.

An example of the way to extend a two dimensional pattern (e.g. a grid pattern) within the subset determined at S20 during the forming S30 is now discussed.

Figure 23:
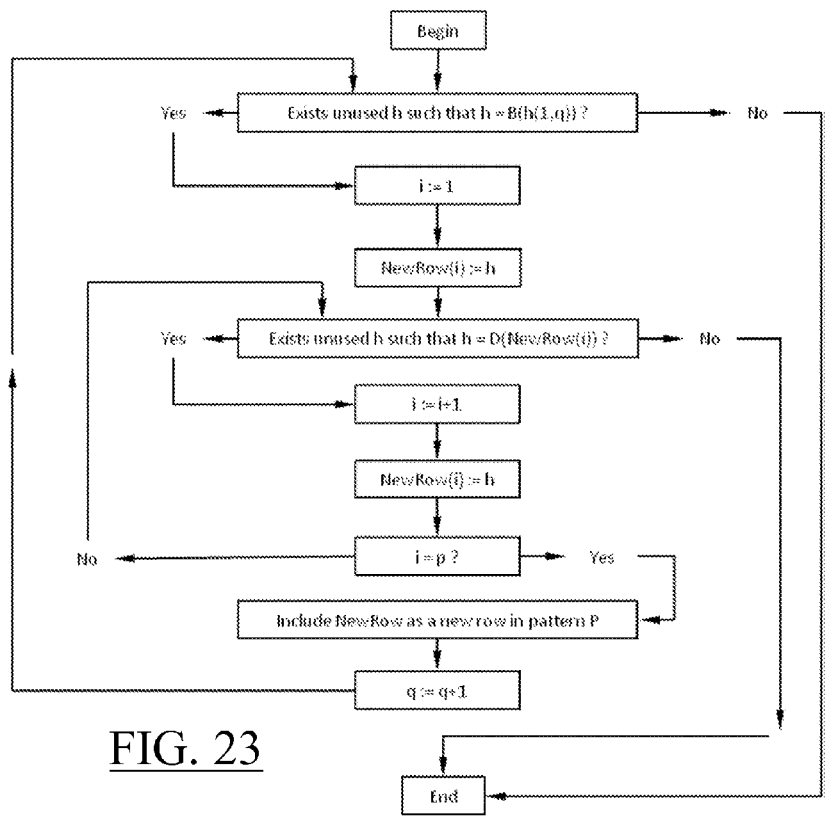
Figure 24:
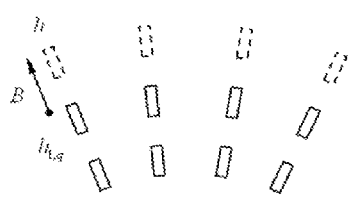
Figure 25:
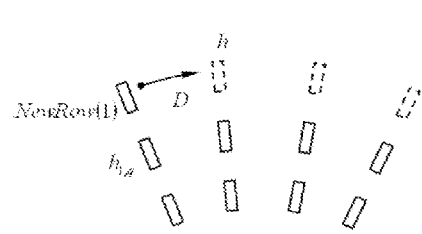
Figure 26:
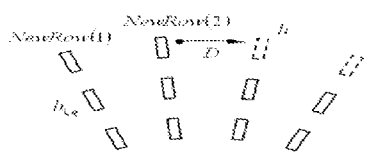
Figure 27:
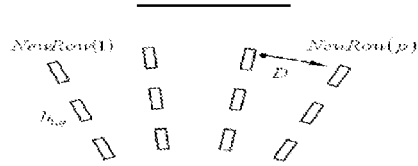

Given a subset H of point-sets and a pattern P initialized in this subset, the goal is to compute the largest pattern including the initial pattern P. The extension process includes a forward row extension algorithm, a backward row extension algorithm, a forward column extension algorithm and a backward column extension algorithm. Given a two dimensional pattern P=({$h_{i,j}$; i=1, ..., p; j=1, ..., q}, D, B), the forward row extension algorithm is as shown on the flowchart of FIG. 23.

FIGS. 24-27 illustrate chronologically the forward row extension algorithm of a circular grid pattern. Dotted lines are point-sets that are not included in the circular pattern being extended. In this example, q=2 and p=4.

Figure 28:
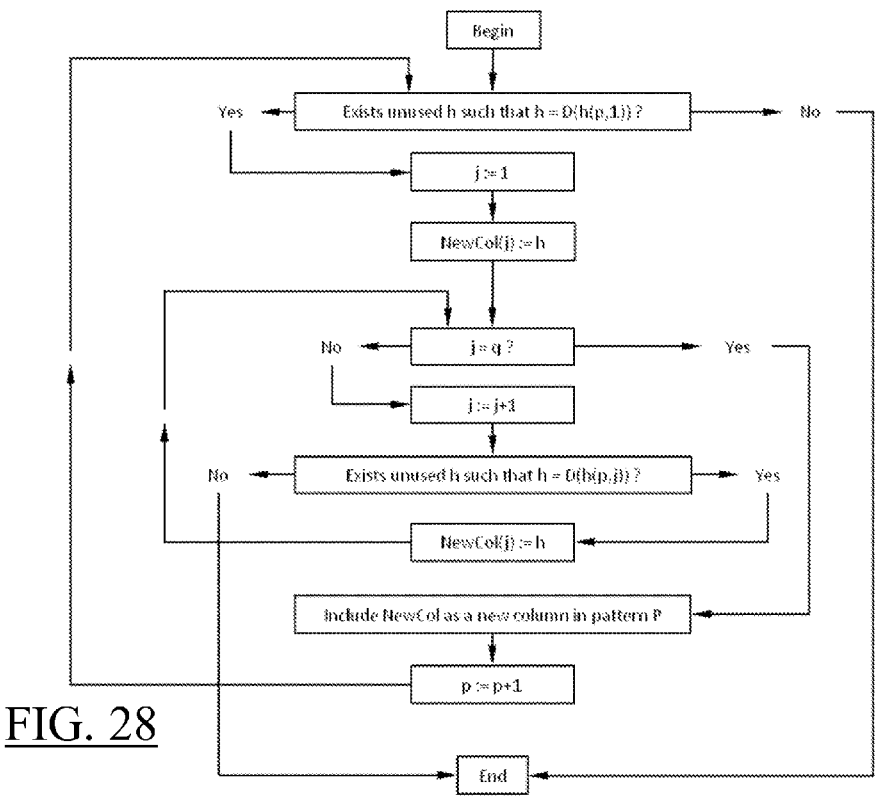
Figure 29:
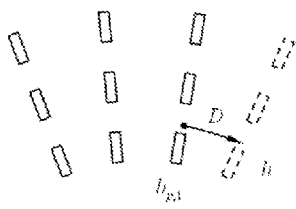
Figure 30:
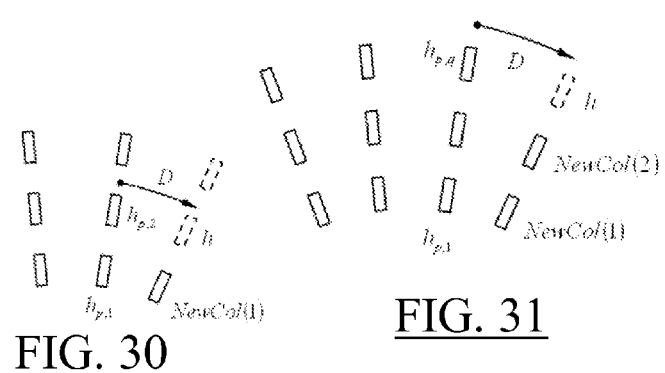
Figure 31:
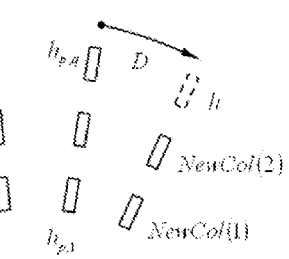

The forward column extension algorithm is as shown on the flowchart of FIG. 28. FIGS. 29-31 illustrate chronologically the forward column algorithm on a circular grid pattern. Dotted lines are point-sets that are not included in the circular pattern being extended. In this example, q=3 and p=3.

Both forward row and forward column extensions algorithms are designed to be used for rectangular and circular grid patterns. Backward row and column extension algorithms are not detailed because they are easily deduced from the forward extension versions. For example, one way is to reverse the numbering of rows and to reverse the numbering of columns.

In all cases, the testing may include browsing the predetermined set of geometrical patterns according to a priority order. In other words, a predetermined (possibly user-defined) priority order is associated to the predetermined set of patterns, and the forming S30 may try to find occurrences of these patterns by performing the testing according to that order. Indeed, after the determining S20, the method looks for patterns within the subset of copies determined at S20. To make the method more adapted to the contemplated application, this may be repeated according to some priority order between the different patterns. For example, all occurrences of the highest priority pattern are formed at S30, if any, then all occurrences of the next priority, if any, and so on until the lowest priority.

Referring to the specific examples of patterns discussed above, the priority order may order, from highest priority to lowest priority, the circular grid pattern, the rectangular grid pattern, the circular pattern, and then the linear pattern. Such a structure is particularly well-adapted (in terms of statistical computational time observed for a set of different users) to the field of mechanical design.

The example of the method at stake deals with the following pattern types: 1D linear, 2D linear, 1D circular and 2D circular. Patterns are searched by the algorithm according to the following decreasing priority list:
1. 2D circular (i.e. circular grid)
2. 2D linear (i.e. rectangular grid)
3. 1D circular
4. 1D linear.

This priority list is based on the following heuristic considerations that give very good results in practice.

One heuristic is that 2D circular is better than 2D linear. Given the input geometry illustrated on FIG. 32, both 2D linear (FIG. 33) and 2D circular (FIG. 34) patterns could theoretically be recognized. The 2D circular pattern is however chosen as the most reasonable design intent.

Another heuristic is that 2D linear is better than 1D circular. Given the input geometry illustrated on FIG. 35, both 1D circular (FIG. 36) and 2D linear (FIG. 37) patterns could theoretically be recognized. The 2D linear pattern is however chosen as the most reasonable design intent.

Another heuristic is that 1D circular is better than 1D linear. Given the input geometry illustrated on FIG. 38, both a partial 1D linear (FIG. 39) and a partial 1D circular (FIG. 40) patterns could theoretically be recognized. The 1D circular pattern is chosen as the most reasonable design intent.

Examples of the associating S40 are now discussed.

Maximal patterns may be computed within each subset through the previous algorithms of the examples. One goal of the associating S40 is to extend as much as possible the patterned point-sets (i.e. the geometrical pattern of faces). The principle is to perform a topological extension to adjacent faces. In other words, for each pattern P and for each element in this pattern, the goal is to grab faces that are adjacent to the said element from other patterns or subsets when the said faces preserve the structure of pattern P. From the data structure point of view, such faces may be moved out of their owning pattern or subset into pattern P (in other words, the method may modify the subsets and geometrical patterns determined at previous iterations).

This topological extension is enhanced as follows. Here again, elements are extended by visiting adjacent faces, but the goal in the example is to identify that copies are not trimmed the same way when duplicated on the solid. The principle in the example is to include in a patterned element the faces that fit the following criteria. (1) The candidate face is adjacent to the patterned element. Note $e_i$, i=1, ..., n the edges shared by the candidate face and the patterned element. (2) The supporting surface of the candidate face fits the pattern structure. (3) The local axis systems (as defined above) of vertices of edges $e_i$ fit the pattern structure.

For example, the pattern recognition algorithm applied to solid 410 of FIG. 41 recognizes and forms, at an iteration of S30, the linear pattern 420 shown on FIG. 42 and including the four top faces 412 of the squared pads 414.

In the example of FIGS. 41-42, adjacent faces of the patterned faces are not copies of each other; this is why they do not belong to any pattern. As illustrated on FIG. 43, faces 432, 433 and 434 are not copies of face 431. Nevertheless, since they fit the topological extension criteria, they are included in the pattern. After all lateral faces are included, the initial pattern 420 becomes pattern 440 shown on FIG. 44.

The number of faces of the second group may be higher than the number of faces of the first group minus a predetermined threshold, for example 1. In other words, when performing the associating S40, the method imposes another constraint before creating the second group: it has to have a certain number of faces, which may be lower than the number of faces of the first group, but higher than this number to which a predetermined threshold is subtracted (it thus has to be above a minimal value). The idea is not to extend the pattern with second groups that are much smaller (in terms of number of elements) than the first group, since this would mean that the adjacent faces considered were probably not intended to follow the pattern. Yet, it is not necessary to have the second group be as large as the first group, since this may be too strict and would inadequately discard situations where local changes occurred after the pattern creation during the design. The method may thus leave some margin for such local changes. The number 1 for the predetermined threshold is a good tradeoff between false positives and false negatives.

The topological extension to adjacent faces can thus take into account faces that do not appear on all copies. For example, solid 450 shown on FIGS. 45-47 (with three different views for the sake of clarity) is considered.

The pattern algorithm recognizes, at the forming S30, the linear sequence of top faces 452 of the square pad, shown on FIG. 48. No other face can be included in pattern 490 shown on FIG. 49 at S30.

The method of the example then includes at S40 the faces that are adjacent to a face of the initial pattern and such that the supporting plane fits the pattern specification (i.e. several iterations of S40 with several second groups of faces adjacent to the first group faces). This progressively yields modifications of pattern 490 as chronologically shown on FIGS. 50-52.

Now, the method may further comprise associating to the first group of faces at least one group of so-called "blocks" of faces. Each block is a set of connected faces (i.e. a block is a set of one or more face(s), which are connected all together via, e.g. transitive, edge-sharing) adjacent to a respective face of the second group and that are, for each pair of blocks, compliant with the rigid motion. In other words, the method further extends the geometrical pattern formed at S30, after having extended it at S40, to new faces that are not adjacent to the first group faces but that are connected to the second group faces.

The criterion retained for the compliancy may be exactly the same as for the associating. In other words, corresponding faces of pairs of blocks have to have supporting surfaces that are derivable one from the other via the rigid motion that transforms the respective first group faces one into the other, at least in an area of adjacency of the considered faces to the respective faces of the pattern (as currently extended). In the case of the present example, the supporting surfaces may actually be exactly (i.e. fully) derivable one from the other, as for the associating S40.

Moreover, although the number of corresponding second group faces may be lower than the number of first group faces (modulo the predetermined threshold), the number of blocks may be constrained to be equal to the number of second group faces. This is because blocks are already "far" from the first group faces.

By allowing faces that are adjacent to some copies and missing in other copies, and by extending the pattern to blocks; pattern 530 of FIG. 53 is computed. This resulting pattern 530 corresponds, as determined by the method of the example, to the following design intent: duplicate feature 540 shown on FIG. 54 on solid 550 shown on FIG. 55.

Issues related to the iteration of the above examples of the steps of the method are now discussed through an example. Since pattern extension reworks patterns and subsets by moving faces from one to another, iterations are necessary to investigate modified patterns and subsets.

For example, an initial model provided at S10 may be arrangement 560 of 11 small squares and 4 large squares shown on FIG. 56. Small squares 8, 9, 10 and 11 are respectively adjacent to large squares 12, 13, 14 and 15. The initial subsets computation algorithm may directly yield subset C={1, . . . , 11} of small squares and subset C'={12, . . . , 15} of large squares. The pattern recognition within subsets may yield a linear pattern P'=({12, . . . , 15}, D) of large squares and a linear grid pattern P=({1, 2, 3, 4, 5, 7, 8, 9, 10, 11}, D, B) of small squares. FIG. 57 illustrates the subsets and patterns status.

The patterns extension algorithm finds that pattern P' can grab faces of small squares 8, 9, 10, 11 because of small and large squares adjacency and because T=D. This operation moves faces from pattern P into pattern P' and deletes pattern P. Updated pattern P' is P'=({{8,12}, {9,13}, {10,14}, {11, 15}}, T). Furthermore, subset C is now C={1, . . . , 7} because elements 8 to 11 contribute to pattern P' and subset C' is deleted because all its elements are involved in pattern P', as illustrated in FIG. 58.

Since subset C is modified, the iteration is launched. It finds the linear pattern P''=({1, . . . , 6}, T), as illustrated in FIG. 59. Subset C is reduced to a single element and the iterations are stopped.

Specific details are now discussed.

Figure 60:
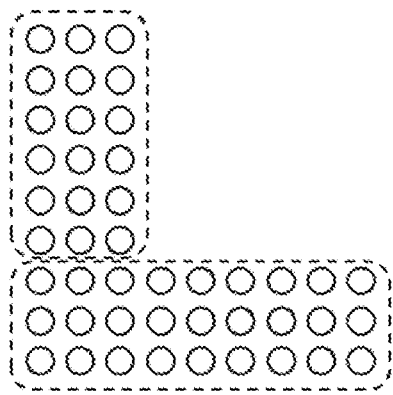
Figure 61:
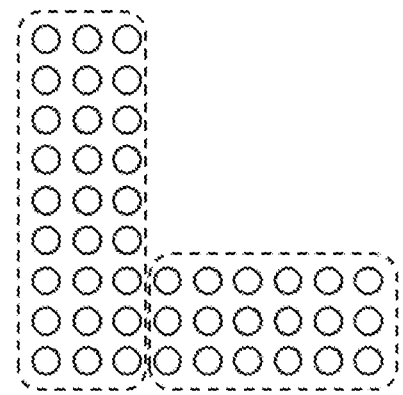

The pattern recognition algorithm described in the invention provides a single result despite several solutions may exist. For example, FIGS. 60-61 illustrate two possible solutions of rectangular patterns (in dotted circles) for the same initial input of disks, and there is, a priori, no reason to prefer one versus the other. The method may randomly compute one among these two.

Also, after a pattern is recognized, one may need a reference version of the feature that is duplicated. Since all copies of the reference features may be altered by trimming operations, it might be useful to compute a "virgin" reference feature, for example for edition purpose. The method may comprise, according to any implementation, such determination of a reference version.

While this invention has been particularly shown and described with references to example embodiments thereof, it will be understood by those skilled in the art that various changes in form and details may be made therein without departing from the scope of the invention encompassed by the appended claims.

What is claimed is:

1. Computer-implemented method for designing a three-dimensional modeled object comprising:
   providing a boundary representation of the modeled object, the boundary representation comprising a set of faces each defined as a bounded portion of a respective supporting surface;
   determining a subset of the set of faces of the boundary representation for which the faces are a copy one of another;
   forming a first group of faces within the subset that form a geometrical pattern; and
   associating to the first group of faces at least one second group of faces that are, for each face of the second group, adjacent to a respective face of the first group and that are, for each pair of faces of the second group, compliant with the rigid motion that transforms, one into the other, the respective faces of the first group to which the faces of the pair are adjacent.

2. The method of claim 1, wherein, for the associating, a pair of faces is evaluated to be compliant with the rigid motion that transforms, one into the other, respective faces of the first group to which the faces of the pair are adjacent, when the rigid motion also transforms, one into the other, the supporting surfaces respective to the faces of the pair, at least in an area of adjacency of the faces of the pair to the respective faces of the first group.

3. The method of claim 1, wherein the number of faces of the second group is higher than the number of faces of the first group minus a predetermined threshold.

4. The method of claim 1, wherein the method further comprises associating to the first group of faces at least one group of blocks of faces that are, for each block, a set of connected faces adjacent to a respective face of the second group and that are, for each pair of blocks, compliant with the rigid motion.

5. The method of claim 1, wherein the method is iterated, the faces included in the first group or associated to the first group in an iteration being discarded for the next iterations.

6. The method of claim 1, wherein forming the first group of faces within the subset comprises testing whether an occurrence of one of a predetermined set of geometrical patterns is present within the subset.

7. The method of claim 6, wherein the predetermined set of geometrical patterns includes a set of recurrently defined patterns.

8. The method of claim 7, wherein the set of recurrently defined patterns includes a one-dimensional pattern including a linear pattern and/or a circular pattern, and/or a grid pattern including a rectangular grid pattern and/or a circular grid pattern.

9. The method of claim 8, wherein the testing includes browsing the predetermined set of geometrical patterns according to a priority order.

10. The method of claim 6, wherein the predetermined set of geometrical patterns includes, a circular grid pattern, a rectangular grid pattern, a circular pattern, and then a linear pattern.

11. The method of claim 10, wherein the testing includes browsing the predetermined set of geometrical patterns according to a priority order that orders, from highest priority to lowest priority, the circular grid pattern, the rectangular grid pattern, the circular pattern, and then the linear pattern.

12. Computer program recordable on a data storage medium and comprising instructions for performing a computer-implemented method for designing a three-dimensional modeled object comprising:
    providing a boundary representation of the modeled object, the boundary representation comprising a set of faces each defined as a bounded portion of a respective supporting surface;
    determining a subset of the set of faces of the boundary representation for which the faces are a copy one of another;
    forming a first group of faces within the subset that form a geometrical pattern; and
    associating to the first group of faces at least one second group of faces that are, for each face of the second group, adjacent to a respective face of the first group and that are, for each pair of faces of the second group, compliant with the rigid motion that transforms, one into the other, the respective faces of the first group to which the faces of the pair are adjacent.

13. A CAD system comprising a processor coupled to a memory and a graphical user interface, the memory having recorded thereon a computer program recordable on a data storage medium and comprising instructions for performing a computer-implemented method for designing a three-dimensional modeled object comprising:
    providing a boundary representation of the modeled object, the boundary representation comprising a set of faces each defined as a bounded portion of a respective supporting surface;
    determining a subset of the set of faces of the boundary representation for which the faces are a copy one of another;
    forming a first group of faces within the subset that form a geometrical pattern; and
    associating to the first group of faces at least one second group of faces that are, for each face of the second group, adjacent to a respective face of the first group and that are, for each pair of faces of the second group, compliant with the rigid motion that transforms, one into the other, the respective faces of the first group to which the faces of the pair are adjacent.

* * * * *